United States Patent
Jain et al.

(10) Patent No.: US 10,515,697 B1
(45) Date of Patent: Dec. 24, 2019

(54) APPARATUSES AND METHODS TO CONTROL OPERATIONS PERFORMED ON RESISTIVE MEMORY CELLS

(71) Applicant: Intel Corporation, Santa Clara, CA (US)

(72) Inventors: Pulkit Jain, Hillsboro, OR (US); Umut Arslan, Hillsboro, OR (US); Fatih Hamzaoglu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/023,728

(22) Filed: Jun. 29, 2018

(51) Int. Cl.
*G11C 13/00* (2006.01)
*G11C 7/06* (2006.01)
*G11C 8/10* (2006.01)

(52) U.S. Cl.
CPC ............ *G11C 13/0069* (2013.01); *G11C 7/06* (2013.01); *G11C 8/10* (2013.01); *G11C 13/004* (2013.01); *G11C 13/0023* (2013.01); *G11C 13/0061* (2013.01); *G11C 2213/79* (2013.01)

(58) Field of Classification Search
CPC .......................... G11C 13/0069; G11C 11/161
USPC ................................................. 365/148, 158
See application file for complete search history.

(56) References Cited

U.S. PATENT DOCUMENTS

| | | | | |
|---|---|---|---|---|
| 4,068,159 A * | 1/1978 | Gyugyi | ................. | H02J 3/1864 323/211 |
| 5,623,444 A * | 4/1997 | Gotou | ....................... | G11C 7/18 365/185.23 |
| 5,883,827 A * | 3/1999 | Morgan | ............. | G11C 13/0004 365/100 |
| 6,768,680 B2 * | 7/2004 | Kato | ................... | G11C 16/3468 365/185.22 |
| 6,920,060 B2 * | 7/2005 | Chow | ..................... | G11C 11/22 365/145 |
| 7,184,348 B2 * | 2/2007 | Crippa | ................ | G11C 11/5642 365/189.15 |
| 7,453,719 B2 * | 11/2008 | Sakimura | ................ | G11C 11/15 365/158 |
| 7,755,923 B2 * | 7/2010 | Liu | ..................... | G11C 11/1673 365/100 |

(Continued)

OTHER PUBLICATIONS

Fackenthal, Richard, et al., "A 16Gb ReRAM with 200MB/s Write and 1GB/s Read in 27nm Technology", IEEE International Solid-State Circuits Conference Digest of Technical Papers (ISSCC), (2014), 3 pgs.

(Continued)

*Primary Examiner* — Michael T Tran
(74) *Attorney, Agent, or Firm* — Schwegman Lundberg & Woessner, P.A.

(57) ABSTRACT

Some embodiments include apparatuses having a resistive memory device and methods to apply a combination of voltage stepping current stepping and pulse width stepping during an operation of changing a resistance of a memory cell of the resistive memory device. The apparatuses also include a write termination circuit to limit drive current provided to a memory cell of the resistive memory device during a particular time of an operation performed on the memory cell. The apparatuses further include a programmable variable resistor and resistor control circuit that operate during sensing operation of the memory device.

24 Claims, 9 Drawing Sheets

(56) References Cited

U.S. PATENT DOCUMENTS

| | | | | |
|---|---|---|---|---|
| 8,144,535 | B2* | 3/2012 | Kang | G11C 29/50008 |
| | | | | 365/185.21 |
| 8,426,242 | B2* | 4/2013 | Cheng | C23C 14/0623 |
| | | | | 438/102 |
| 9,064,577 | B2* | 6/2015 | Zhao | G11C 16/0483 |
| 9,099,174 | B2* | 8/2015 | Calderoni | G11C 11/00 |
| 9,208,872 | B2* | 12/2015 | Shiimoto | G11C 13/004 |
| 9,263,097 | B2* | 2/2016 | Knoedgen | G11C 17/16 |
| 9,299,430 | B1* | 3/2016 | Bertin | G11C 13/0069 |
| 9,312,018 | B1* | 4/2016 | Yamada | G11C 16/26 |
| 9,355,721 | B2* | 5/2016 | Yoon | G11C 13/0069 |
| 9,373,402 | B2* | 6/2016 | Yoo | G11C 16/10 |
| 9,384,799 | B2* | 7/2016 | Koudele | G11C 7/1066 |
| 9,431,106 | B1* | 8/2016 | Roy | G11C 15/046 |
| 9,455,013 | B2* | 9/2016 | Kim | G11C 11/1673 |
| 9,467,129 | B2* | 10/2016 | Kousai | H03K 5/131 |
| 9,496,036 | B1* | 11/2016 | Chen | G11C 13/0069 |
| 9,543,957 | B2* | 1/2017 | Oda | H03K 19/1776 |
| 9,576,653 | B1* | 2/2017 | Chou | G11C 13/004 |
| 9,691,459 | B2* | 6/2017 | Seo | G11C 7/14 |
| 9,711,216 | B2* | 7/2017 | Hase | G11C 13/0069 |
| 9,959,927 | B2* | 5/2018 | Zhou | G11C 13/0064 |
| 10,008,276 | B2* | 6/2018 | Huynh | G11C 29/025 |
| 10,049,740 | B2* | 8/2018 | Sugahara | G11C 14/0081 |
| 10,049,748 | B2* | 8/2018 | Hong | G11C 16/08 |
| 10,153,021 | B1* | 12/2018 | Di Vincenzo | G11C 11/2273 |
| 10,199,099 | B2* | 2/2019 | Hori | G11C 11/56 |
| 10,210,801 | B2* | 2/2019 | Lin | G09G 3/3233 |
| 10,242,738 | B2* | 3/2019 | Kolluri | G11C 13/0069 |
| 10,249,249 | B2* | 4/2019 | Takahashi | G06F 3/041 |
| 10,249,690 | B2* | 4/2019 | Okazaki | H01L 27/3223 |
| 10,360,962 | B1* | 7/2019 | Karmakar | G11C 7/08 |
| 2006/0034112 | A1 | 2/2006 | Oh et al. | |
| 2009/0201717 | A1* | 8/2009 | Maeda | G11C 11/16 |
| | | | | 365/148 |
| 2011/0134687 | A1 | 6/2011 | Lee et al. | |
| 2012/0120712 | A1 | 5/2012 | Kawai et al. | |
| 2012/0170359 | A1 | 7/2012 | Wu et al. | |
| 2013/0051123 | A1* | 2/2013 | Lee | G11C 8/00 |
| | | | | 365/148 |
| 2013/0073598 | A1* | 3/2013 | Jacobson | G06F 7/588 |
| | | | | 708/252 |
| 2015/0016177 | A1 | 1/2015 | Matsunami | |

OTHER PUBLICATIONS

Kawahara, Akifumi, et al., "Filament scaling forming technique and level-verify write scheme with endurance over 107 cycles in ReRAM", in Proc. IEEE Int. Solid-State Circuits Conf. Dig. Tech. Papers; 220-221, (2013), 3 pgs.

Kawai, Ken, et al., "Highly-reliable TaOx ReRAM Technology using Automatic Forming Circuit", IEEE International Conference on IC Design & Technology (ICICDT), (2014), 4 pgs.

Lin, Yu-Hsuan, et al., "Excellent resistance variability control of WOX ReRAM by a smart writing algorithm", IEEE, (2016), 2 pgs.

Muraoka, S., et al., "Comprehensive Understanding of Conductive Filament Characteristics and Retention Properties for Highly Reliable ReRAM", 2013 Symposium on VLSI Technology Digest of Technical Papers, (2013), 2 pgs.

Wang, Zhibo, et al., "A 65-nm ReRAM-Enabled Nonvolatile Processor with Time-Space Domain Adaption and Self-Write-Termination Achieving >4× Faster Clock Frequency and >6× Higher Restore Speed", IEEE Journal of Solid State Circuits, vol. 52, No. 10; 2769-2785, (Oct. 2017), 17 pgs.

"International Application Serial No. PCT US2019 039469, International Search Report dated Oct. 18, 2019", 3 pgs.

"International Application Serial No. PCT US2019 039469, Written Opinion dated Oct. 18, 2019", 6 pgs.

* cited by examiner

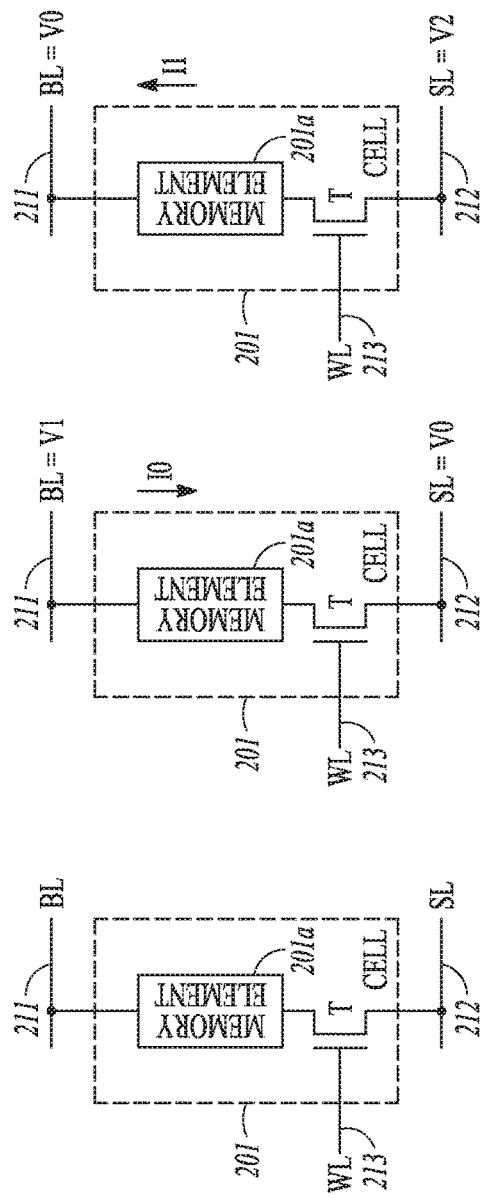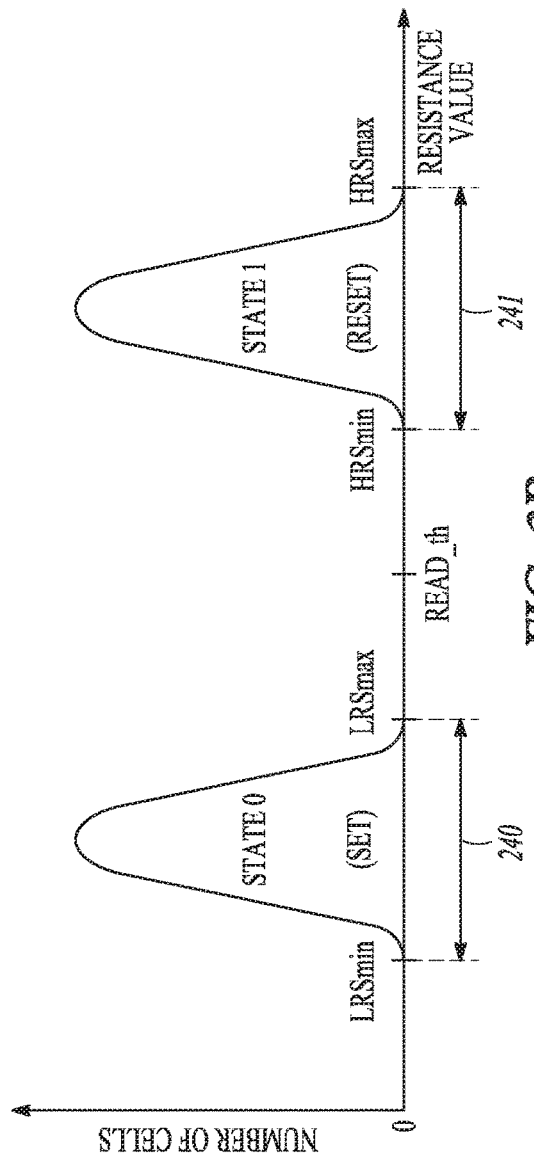

APPARATUSES AND METHODS TO CONTROL OPERATIONS PERFORMED ON RESISTIVE MEMORY CELLS

TECHNICAL FIELD

Embodiments described herein pertain to memory circuitry in electronic devices and systems. Some embodiments relate to resistive memory devices.

BACKGROUND

Non-volatile memory devices, such as resistive memory devices, often have precise placement of different resistance values ranges for the memory cells that can be used to represent different values of information stored in the memory cells. Values that are too low or too high in such ranges can impact switching yield and endurance of the information (e.g, bit) stored in the memory cells. Further, a too small margin between such ranges can cause non-volatility loss of information or failure to read information from the memory cells. Conventional techniques have been proposed to address the mentioned phenomena. However, as described in more detail below, some of the conventional techniques may have drawbacks.

BRIEF DESCRIPTION OF THE DRAWINGS

FIG. 2A shows a memory cell including a memory element and a transistor, according to some embodiments described herein.

FIG. 2B shows resistance value ranges for different states (e.g, resistance states) that can be stored in the memory cell of FIG. 2A, according to some embodiments described herein.

FIG. 2C and FIG. 2D show currents flowing through the memory cell of FIG. 2A, and voltages applied to respective conductive lines coupled to the memory cell during different operations performed on the memory cell, according to some embodiments described herein.

DETAILED DESCRIPTION

The techniques described herein include an improved resistive memory device and its operations. The described techniques include applying a combination of voltage stepping current stepping and pulse width stepping during an operation of storing information in a memory cell of a resistive memory device. The order of voltage stepping current stepping and pulse width stepping can be dependent on the value of information to be stored in the memory cell. The described techniques also include a write termination circuit to limit (on the fly) drive current provided to the memory cell after the memory cell reaches a reference resistance value. The techniques described herein further include a programmable variable resistor and resistor control circuitry to improve accuracy in sensing (e.g, read and verify) operations of the memory device. Improvements and benefits of the described techniques are discussed below with reference to FIG. 1 through FIG. 8.

Figure 1:
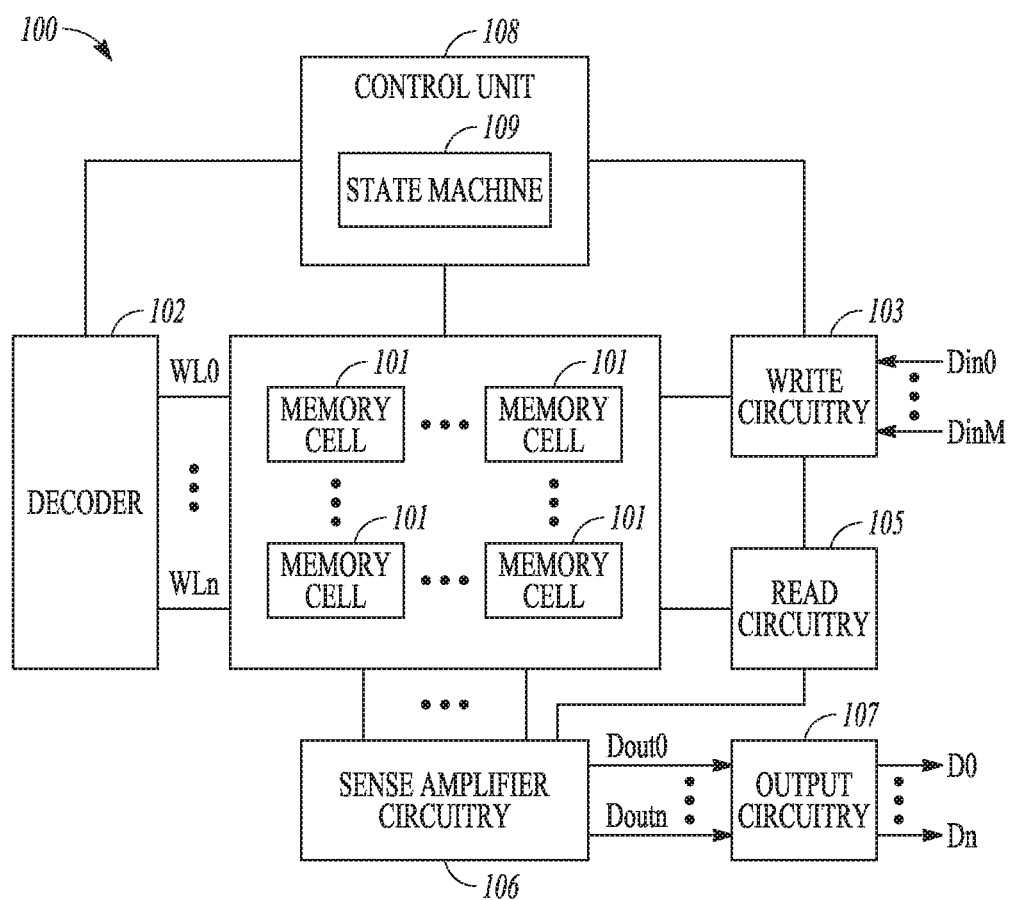
FIG. 1 shows an apparatus in the form of a memory device, according to some embodiments described herein.

FIG. 1 shows an apparatus in the form of a memory device 100, according to some embodiments described herein. Memory device 100 can include memory cells 101, which can include non-volatile memory cells. Each of memory cells 101 can include a resistive memory cell. A resistive memory cell includes a memory cell that can be configured (e.g, programmed) to store information in which the value of information stored in the memory cell is based on the value of the resistance across of the memory cell (e.g, across the terminals of the memory cells). An example of a resistive memory cell described herein includes filamentary resistive memory cell, conductive bridge memory cell, phase change memory cell, and other types of resistive memory cells.

Each of memory cells 101 can be configured to store at most one bit (e.g, a singe bit) of information. Alternatively, each of memory cells 101 can be configured to store more than one bit (e.g, multiple bits) of information. Each of memory cells 101 can include the memory cells described below with reference to FIG. 2 through FIG. 8.

As shown in FIG. 1, memory device 100 can include a memory control unit (e.g, control circuitry) 108 to control memory operations (e.g, read and write operations) of memory device 100. Control unit 108 can include a state machine (e.g, a finite state machine) 109 that can operate to change operations of memory device 100 from one operating state to another operating state. Control unit 108 can control the values of voltages, currents, and pulse widths of signals generated by memory device 100 during read and write operations.

Memory device 100 can store information in memory cells 101 during a write operation and read information (e.g, previously stored information) from memory cell 101 during a read operation. The write operation can include at least one write stage (one write stage or multiple write stages) and at least one verify stage (one verify stage or multiple verify stages). However, the write operation may skip a write stage (e.g, may include zero write stage) if the memory cell is already at a correct state based on the first verify stage at the beginning of the write operation. A write stage can store information in a selected memory cell. A verify stage can verify (e.g, determine) whether the selected memory cell reaches a target state (e.g, a target resistance value) that reflects the value (e.g, binary zero ("0") or binary ("1")) of information to be stored in the selected memory cell.

Memory device 100 can include a decoder (e.g., word line decoder) 102 that can use signals (e.g., word line signals) WL0 through WLn to selectively access memory cells 101 during a write operation or a read operation. Memory device 100 can include write circuitry 103 that can operate during a write operation to store information in memory cells 101. For example, during a write operation, write circuitry 103 can provide signals (e.g., current signals and voltage signals) to a selected memory cell (or selected memory cells) among memory cells 101. The signals can cause the selected memory cell to change between different states (e.g., different resistance states) to reflect the value (e.g., "0" or "1") of information stored in the selected memory cell. Write circuitry 103 can receive input information (e.g., input data) Din0 through DinM from another component of memory device 100 or from another device (e.g., external device) coupled to memory device 100. Information to be stored in memory cells is based on input information Din0 through DinM.

As shown in FIG. 1, memory device 100 can include read circuitry 105 and sense amplifier circuitry 106. During a read operation (and during a verify stage (write verify stage) of a write operation), read circuitry 105 and sense amplifier circuitry 106 can operate to sense information (e.g, to sense the state (e.g, resistance state) of a selected memory (or memory cells) among memory cells 101. Output circuitry 107 can provide information (e.g., output data) D0 through Dn based on information (e.g., sensed information) Dout0 through DoutN sensed from a selected memory cell (or memory cells). Information D0 through Dn (bits of data) can be used by internally by memory device 100 or by another device (e.g., external device) coupled to memory device 100.

One of ordinary skill in the art may recognize that memory device 100 may include other components, several of which are not shown in FIG. 1 so as not to obscure the example embodiments described herein. At least a portion of memory device 100 can include elements (e.g., circuit elements) and perform operations similar to or identical to the elements and operations of any of the memory devices described below with reference to FIG. 2 through FIG. 8.

FIG. 2A shows a memory cell 201 including a memory element 201a and a transistor T, according to some embodiments described herein. Memory cell 201a can be one of memory cells 101 of FIG. 1. Memory element 201a can include a material (or materials) that can be configured to store information in the form of a state (e.g., a resistance state) of memory element 201a. Transistor T can be controlled (e.g., turned on or turned off) by a signal (e.g., word line signal) WL on conductive line 213. For example, transistor T can be turned on to select (or access) memory cell 201 during a write operation to store information in memory cell 201 or during a read operation to read information from memory cell 201. Transistor T can be turned off to deselect (or not to access) memory cell 201 if memory cell 201 is not selected to store information in it or if memory cell 201 is not selected to provide information from it. Transistor T can include a field-effect transistor (FET), such as a p-channel metal-oxide semiconductor FET (PMOS) or an n-channel M OSFET (NM OS), or any general 2-port threshold switching selector. FIG. 2A shows transistor T being an NMOS transistor as an example. However, transistor T can be a PMOS transistor or alternatively a 2-port selector.

Conductive lines 211 and 212 coupled to memory cell 201 can carry signal BL (e.g., bit line signal) and SL (e.g., source line signal), respectively. Each of signals BL and SL can have different values (e.g., voltage or current values) depending on whether memory cell 201 is selected during a read or write operation. Conductive lines 211 and 212 can be coupled to circuitry (not shown) of the memory device (e.g., memory device 100) that includes memory cell 201. Such circuitry can be similar to write circuitry 103, read circuitry 105, and sense amplifier circuitry 106 of FIG. 1 and can operate to store information in or read information from memory cell 201.

FIG. 2B shows resistance value ranges 240 and 241 for different states (e.g., resistance states) including state 0 and state 1 that can be stored in memory cell 201, according to some embodiments described herein. As shown in FIG. 2B, for a number of memory cells similar to memory cell 201 (e.g., memory cells 101 of FIG. 1), state 0 can be within a resistance value range 240, and state 1 can be within a resistance value range 241. State 0 can be called a "SET" state and state 1 can be called a "RESET" state. State 0 can also be called a "FORMING" state. For example, after memory cell 201 is fabricated, a "FORM" operation is performed to initiate a conductive path in memory cell 201 (e.g., initiate a filament in memory element 201a), thereby changing the resistance of memory cell 201. For example, the resistance of memory cell 201 after the FORM operation can be less than resistance of memory cell 201 before the FORM operation. The FORM operation may use more power (e.g., voltage) the SET operation. However, if the drive current used for the FORM operation is kept to be the same as the driver current for the SET operation, then a final resistance of memory cell 201 after the FORM operation can be the same as the resistance value range for the SET state (e.g., resistance value range 240 in FIG. 2B). Thus, in the description herein, operations for a SET state can also be applicable to operations for a FORMING state.

State 0 (e.g, SET state) can be used to represent a value (e.g., "0") of information stored in memory cell 201. State 1 (e.g, RESET state) can be used to represent another (e.g., "1") of information stored in memory cell 201. Thus, the value (e.g, bit value) of information stored in in memory cell 201 can be based on the state (e.g., either state 0 and state 1) of memory cell 201. For example, if memory cell 201 has state 0, then the value of information stored in in memory cell 201 can have a value of "0". If memory cell 201 has state 1, then the value of information stored in in memory cell 201 can have a value of "1".

During a write operation to store information in memory cell 201, the state (e.g., the resistance state) of memory cell 201 can be changed from state 0 (e.g, SET state) to state 1 (e.g., RESET state) or from state 1 (e.g, RESET state) to state 0 (e.g., SET state), depending the value of information to be stored in memory cell 201.

As shown in FIG. 2B, resistance value range 240 can include a resistance value LRSmin (e.g., minimum low resistance state value) and LRSmax (e.g., maximum low resistance state value) that can be minimum and maximum resistance values, respectively, of resistance value range 240. Resistance value range 241 can include a resistance value HRSmin (e.g., minimum high resistance state value) and HRSmax (e.g., maximum high resistance state value) that can be minimum and maximum resistance values, respectively, of resistance value range 241. Thus, resistance value ranges 240 and 241 can have relative resistance values of LRSmin<LRSmax<HRSmin<HRSmax. As shown in FIG. 2B, resistance value ranges 280 and 281 include no-overlap in resistance values to allow a distinction between different states (e.g, state 0 and state 1) of memory cell 201.

In FIG. 2B, resistance value READ_th can be used as a threshold resistance value (e.g., a read reference resistance value) for reading information from memory cell 201. For example, during a read operation, the resistance of memory cell 201 can be determined (to determine the value of information stored in memory cell 201) based on a comparison of the resistance of memory cell 201 with resistance value READ_th. A sense amplifier (not shown in FIG. 2B) can be used to compare a value (e.g., voltage or current value) of a signal sensed from memory cell 201 with a value of a signal (e.g., a reference signal) generated based on resistance value READ_th. The value of information stored in memory cell 201 during a read operation can be determined based on whether the resistance of memory cell 201 is less than or greater than resistance value READ_th. For example, if the resistance of memory cell 201 is less than resistance value READ_th, then the information stored in memory cell 201 can be deemed to have a state 0 (e.g., to correspond to "0"). In another example, if the resistance of memory cell 201 is greater than resistance value READ_th, then the information stored in memory cell 201 can be deemed to have state 1 (e.g., to correspond to "1").

Resistance values LRSmax and HRSmin can be used as threshold resistance values (e.g., verify reference resistance value) during a verify stage of a write operation of storing information in memory cell 201. For example, if information having a value of "0" is to be stored in memory cell 201 during a write operation, then resistance value LRSmax can be used as threshold resistance value during a verify stage of the write operation in this example. The verify stage in this example can determine whether memory cell 201 is within a target resistance value range (e.g., within resistance value range 240 in this example). In another example, if information having a value of "1" is to be stored in memory cell 201 during a write operation, then resistance value HRSmax can be used as threshold resistance value during a verify stage of the write operation in this example. The verify stage in this example can determine whether memory cell 201 is within a target resistance value range (e.g., within resistance value range 241 in this example).

Figure 7:
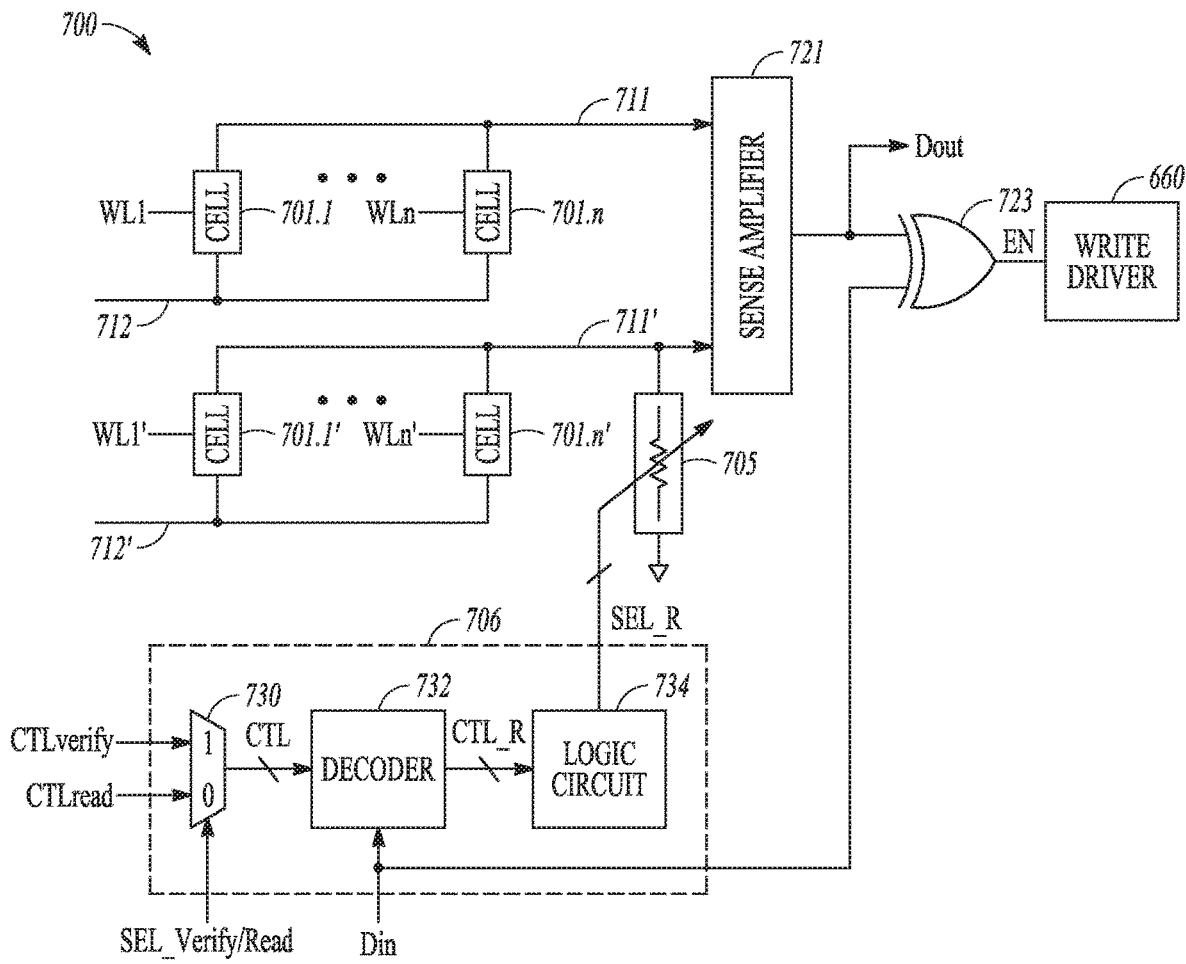
FIG. 7 shows a memory device including a variable resistor and resistor control circuitry, according to some embodiments described herein.

Thus, different resistance values (e.g., READ_th, LRSmax, and HRSmin) as shown in FIG. 2B can be used as threshold resistance values during a read operation (to determine the value of information previously stored in memory cell 201) or during a verify stage of a write operation (to determine whether memory cell 201 is within a target resistance value range). FIG. 7 (described in more detail below) shows an example of a variable resistor that can be configured to provide different resistances (e.g., resistances having resistance values similar to or the same as resistance values READ_th, LRSmax, and HRSmin) during a read operation or a verify stage.

FIG. 2C and FIG. 2D show currents I0 and I1 flowing through memory cell 201, and voltages V0, V1, and V2 applied to respective conductive lines 211 and 212 during different operations performed on memory cell 201, according to some embodiments described herein. Voltage V0 can be ground potential (e.g., V0=0). Each of voltages V1 and V2 can include a supply voltage (or can be generated based on the supply voltage) of the memory device that includes memory cell 201. Each of voltages V1 and V2 can have a value greater than the value of voltage V0 (e.g., V1>V0 and V2>V0). The values of voltages V1 and V2 can be the same or can be different.

As shown in FIG. 2C, current I0 can flow through memory cell 201 in the direction from conductive line 211 to conductive line 212. Current I0 can represent a current flowing through memory cell 201 during a write stage and a verify stage of a write operation in which information to be stored in memory cell 201 can have a value corresponding to state 0 (e.g., SET state). Current I0 can also represent a current flowing through memory cell 201 during a read operation to read information from memory cell 201. As shown in FIG. 2C, voltages V1 and V0 can be applied to conductive line 211 and conductive line 212, respectively, such that signals BL and SL can be provided with voltages V1 and V0, respectively (e.g., BL=V1 and SL=V0).

As shown in FIG. 2D, current I1 can flow through memory cell 201 in the direction from conductive line 212 to conductive line 211. Current I1 can represent a current flowing through memory cell 201 during a write stage and a verify stage of a write operation in which information to be stored in memory cell 201 can have a value corresponding to state 1 (e.g., RESET state). As shown in FIG. 2D, voltages V2 and V0 can be applied to conductive line 212 and conductive line 211, respectively, such that signals BL and SL can be provided with voltages V0 and V2, respectively (e.g., BL=V0 and SL=V2).

As described in more detail below with reference to FIG. 3, FIG. 4, and FIG. 5, the value of each of voltages V1 and V2 can be controlled (e.g., increased (e.g., step up) or kept unchanged) during a write operation performed on memory cell 201. The value of each of currents I0 and I1 can also can be controlled (e.g., increased (e.g., step up) or kept unchanged) during a write operation performed on memory cell 201. The pulse widths of voltages V1 and V2 and currents I0 and I1 can also be controlled. Different combinations of the values (e.g., amplitudes) and pulse widths of voltages V1 and V2 and currents I0 and I1 are described below.

Figure 3:
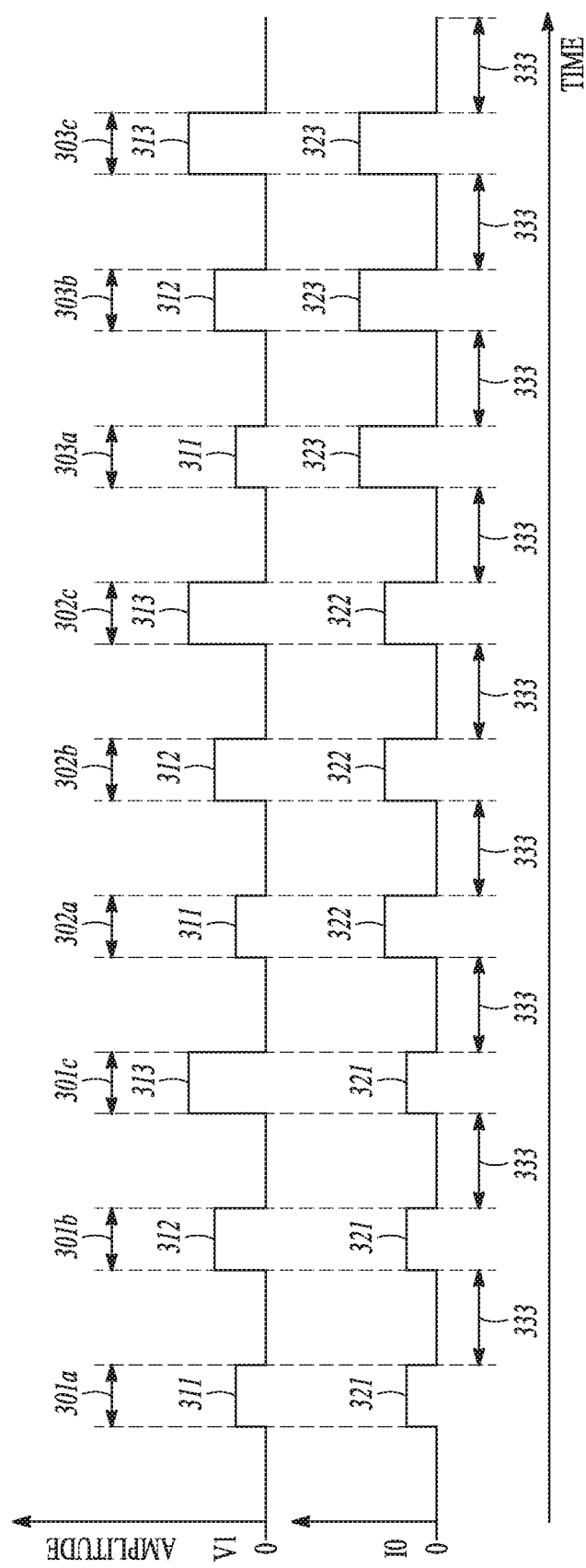
FIG. 3 shows example waveforms of voltage and current during a write operation to store information having a value corresponding to state 0 (e.g, SET state (or alternatively FORMING state)) in the memory cell of FIG. 2A, according to some embodiments described herein.
Figure 4:
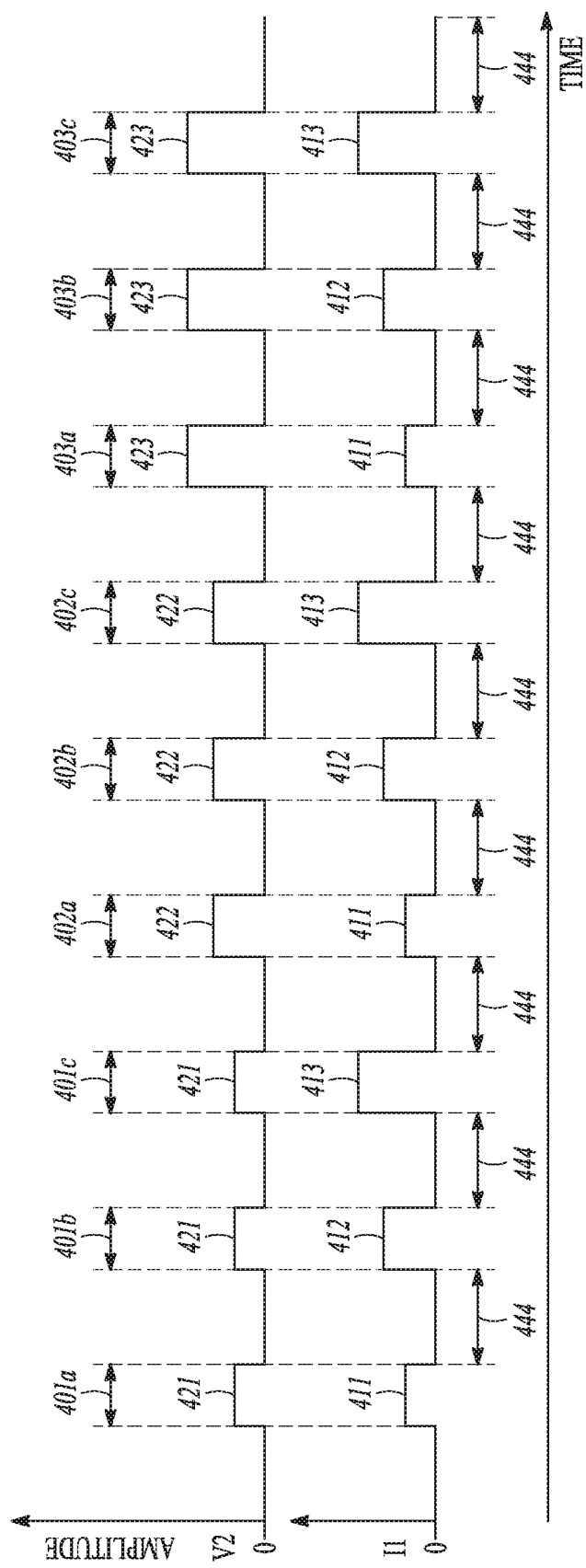
FIG. 4 shows example waveforms of voltage and current during a write operation to store information having a value corresponding to state 1 (e.g, RESET state) in the memory cell of FIG. 2A, according to some embodiments described herein.
Figure 5:
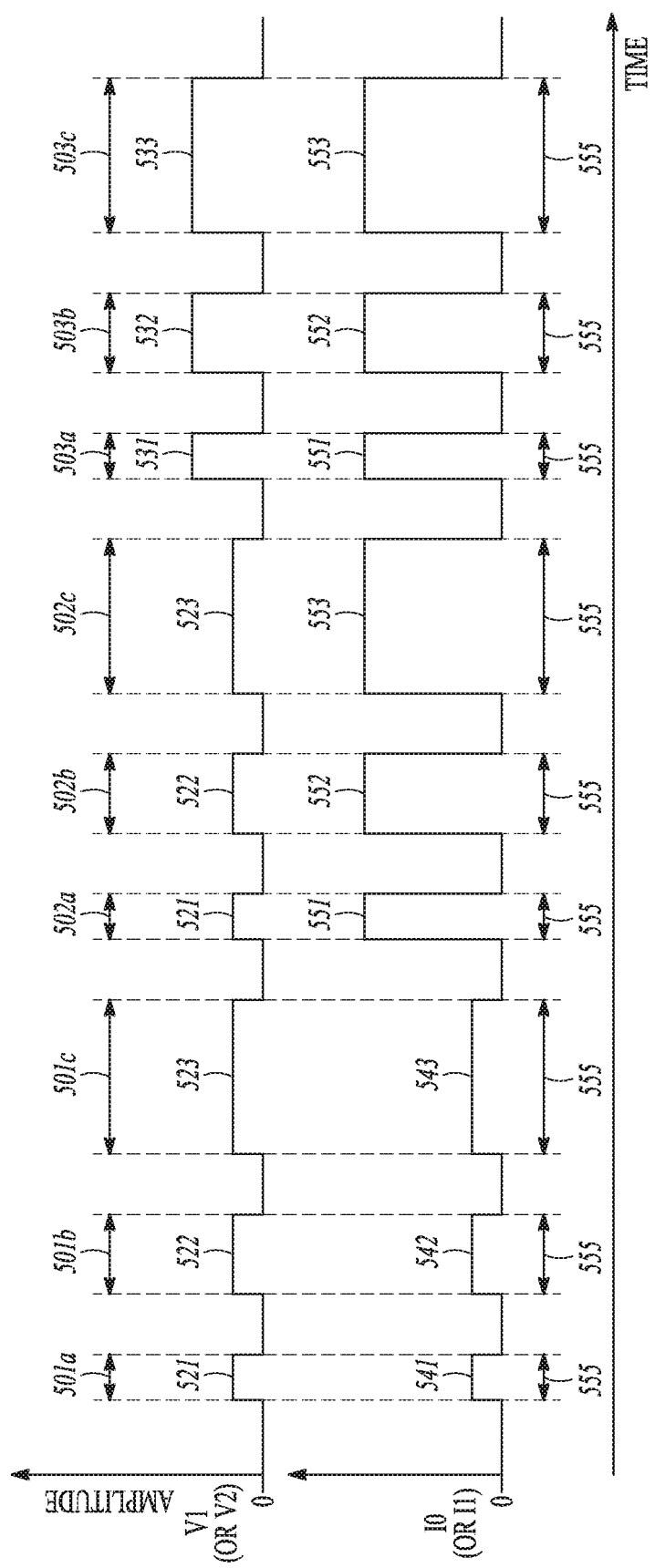
FIG. 5 shows example waveforms of voltage and current having different pulse widths during a write operation to store information in the memory cell of FIG. 2A, according to some embodiments described herein.

FIG. 3, FIG. 4, and FIG. 5 show example waveforms of voltages V1 and V2 and currents I0 and I1 during a write operation to store information in memory cell 201 of FIG. 2A, according to some embodiments described herein. In FIG. 3, information having a value corresponding to state 0 (e.g., SET state) is assumed to be stored in memory cell 201, such that the value of a bit of information stored in memory cell 201 can be "0" (for example). In FIG. 4, information having a value corresponding to state 1 (e.g., RESET state) is assumed to be stored in memory cell 201, such that the value of a bit of information stored in memory cell 201 can be "1" (for example). FIG. 5 shows an example of a combination of different values (e.g., amplitudes) and pulse widths of voltage V1 (or alternatively V2) and current I0 (or alternatively I1) that can be used during storing information in memory cell 201.

FIG. 3 shows different time intervals, which can include time intervals 301a, 301b, and 301c (also called time intervals 301abc for simplicity), time intervals 302a, 302b, and 302c (also called time intervals 302abc for simplicity), time intervals 303a, 303b, and 303c (also called time intervals 303abc for simplicity), and different time intervals 333. The write operation in the example of FIG. 3 can include write stages that can be performed during respective time intervals 301abc, 302abc, and 303abc. The write stages can be performed to change (e.g., gradually change) the resistance of memory cell 201 to a target resistance value based on the value of information to be stored in memory cell 201. For example, memory cell 201 may have a resistance R1 before time interval 301a (e.g., before a write operation) and a resistance R2 after time interval 303c (e.g., after the write operation) where the value of resistance R2 is less than the value of resistance R1 (e.g., R2<R1).

The write operation in the example of FIG. 3 can also include verify stages (write verify stages) that can be performed during respective time intervals 333. The verify stages can be performed to determine (e.g, to verify) whether the resistance of memory cell 201 is within the target resistance value range. As mentioned above, FIG. 3 shows an example where information having a value corresponding state 0 (e.g, SET state) is assumed to be stored in memory cell 201. Thus, a verify stage performed during each of time intervals 333 can determine whether memory cell 201 is within resistance value range 240 (FIG. 2B), which is the target resistance value range for the example of FIG. 3.

As shown in FIG. 3, the value of voltage V1 can be increased (e.g, stepped up) from time interval 301a to 301c. For example, voltage V1 can have three different values based on three different amplitudes of voltage pulses 311, 312, and 313, respectively, during respective time intervals 301abc. The voltage value of voltage V1 during time interval 301b can be greater than the value of voltage V1 during time interval 301a, as indicated by the amplitude of voltage pulse 312 during time interval 301b being greater than the amplitude of voltage pulse 311 during time interval 301a. The voltage value of voltage V1 during time interval 301c can be greater than the value of voltage V1 during time interval 301b, as indicated by the amplitude of voltage pulse 313 during time interval 301c being greater than the amplitude of voltage pulse 312 during time interval 301b. The write operation associated with FIG. 3 can repeat the values of voltage V1 during time intervals 302abc and time intervals 303abc. Thus, the values of voltage V1 during time intervals 301a, 302a, and 303a can be equal (or substantially equal). The values of voltage V1 during time intervals 301b, 302b, and 303b can be equal (or substantially equal). The values of voltage V1 during time intervals 301c, 302c, and 303c can be equal (or substantially equal).

As shown in FIG. 3, the value of current I0 can remain the same during time intervals 301abc. For example, current I0 can have the same current value based on the same amplitude of current pulses 321 during respective time intervals 301abc. The value of current I0 can have the same current value based on the same amplitude of current pulses 322 during respective time intervals 302abc. The value of current I0 can have the same current value based on the same amplitude of current pulses 323 during respective time intervals 303abc. However, the values of current I0 can be increased from time intervals 301abc to time intervals 302abc, and from time intervals 302abc to time intervals 303abc. For example, the value of current I0 during time intervals 302abc can be greater than the value of current I0 during time interval 301a, as indicated by the amplitude of current pulse 322 during time intervals 302abc being greater than the amplitude of current pulse 321 during time interval 301a. The voltage value of current I0 during time interval 303abc can be greater than the value of current I0 during time interval 302abc, as indicated by the amplitude of voltage pulse 323 during time interval 303abc being greater than the amplitude of current pulse 322 during time interval 302abc.

FIG. 3 shows an example where the write operation of storing information (e.g, storing state 0) in memory cell 201 may include nine voltage pulses (e.g, voltage steps) and nine corresponding current pulses performed in nine corresponding write stages (e.g, performed during time intervals 301abc, 302abc, and 303abc). However, the number of write stages can be different from nine. Thus, the number of voltage and current pulses can be different from nine. The number of verify stages (e.g, which is based on the number of write stages) can also be different from the number of verify stages associated with FIG. 3.

FIG. 3 shows an example where the pulse width of each of voltage pulses 311, 312, and 313 is the same. However, the pulse widths of voltage pulses 311, 312, and 313 can be different. For example, the pulse width of voltage pulse 312 can be greater than the pulse width of voltage pulse 311, and the pulse width of voltage pulse 313 can be greater than the pulse width of voltage pulse 312. Likewise, FIG. 3 shows an example where the pulse width of each of current pulses 321, 322, and 323 is the same. However, the pulse widths of current pulses 321, 322, and 323 can be different. For example, the pulse width of current pulse 322 can be greater than the pulse width of current pulse 321, and the pulse width of current pulse 323 can be greater than the pulse width of current pulse 322.

As described above, the value of voltage V1 can be increased (e.g, supply voltage stepping) before the value of current I0 is increased (e.g, drive current stepping) if the information having a value corresponding to state 0 (e.g, SET state) is to be stored in memory cell 201 during a write operation. A combination of different voltage values of voltage V1, different current values of current I0, different pulse widths of voltage V1, and different pulse widths of current I0 can be used in the example write operation associated with FIG. 3.

FIG. 4 shows different time intervals, which can include time intervals 401a, 401b, and 401c (also called time intervals 401abc for simplicity), time intervals 402a, 402b, and 402c (also called time intervals 402abc for simplicity), time intervals 403a, 403b, and 403c (also called time intervals 403abc for simplicity), and different time intervals 444. The write operation in the example of FIG. 4 can include write stages that can be performed during respective time intervals 401abc, 402abc, and 403abc. The write stages can be performed to change (e.g, gradually change) the resistance of memory cell 201 to a target resistance value based on the value of information to be stored in memory cell 201. For example, memory cell 201 may have a resistance R2 before time interval 401a (e.g, before a write operation) and a resistance R3 after time interval 403c (e.g, after the write operation) where the value of resistance R3 is greater than the value of resistance R2 (e.g, R3>R2).

The write operation in the example of FIG. 4 can also include verify stages (write verify stages) that can be performed during respective time intervals 444. The verify stages can be performed determine (e.g, to verify) whether the resistance of memory cell 201 is within the target resistance value range. As mentioned above, FIG. 4 shows an example where information having a value corresponding state 1 (e.g, RESET state) is assumed to be stored in memory cell 201. Thus, a verify stage performed during each of time intervals 444 can determine whether memory cell 201 is within resistance value range 241 (FIG. 2B), which is the target resistance value range for the example of FIG. 4.

As shown in FIG. 4, the value of current I2 can be increased (e.g, stepped up) from time interval 401a to 401c. For example, current I1 can have three different values based on three different amplitudes of current pulses 411, 412, and 413, respectively, during respective time intervals 401abc. The voltage value of current I1 during time interval 401b can be greater than the value of current I1 during time interval 401a, as indicated by the amplitude of current pulse 412 during time interval 401b being greater than the amplitude of current pulse 411 during time interval 401a. The voltage value of current I1 during time interval 401c can be greater than the value of current I1 during time interval 401b, as indicated by the amplitude of current pulse 413 during time interval 401c being greater than the amplitude of current pulse 412 during time interval 401b. The write operation associated with FIG. 4 can repeat the values of current I1 during time intervals 402abc and time intervals 403abc. Thus, the values of current I1 during time intervals 401a, 402a, and 403a can be equal (or substantially equal). The values of current I1 during time intervals 401b, 402b, and 403b can be equal (or substantially equal). The values of current I1 during time intervals 401c, 402c, and 403c can be equal (or substantially equal).

As shown in FIG. 4, the value of voltage V2 can remain the same during time intervals 401abc. For example, voltage V2 can have the same voltage value based on the same amplitude of voltage pulses 421 during respective time intervals 401abc. The value of voltage V2 can have the same voltage value based on the same amplitude of voltage pulses 422 during respective time intervals 402abc. The value of voltage V2 can have the same voltage value based on the same amplitude of voltage pulses 423 during respective time intervals 403abc. However, the values of voltage V2 can be increased from time intervals 401abc to time intervals 402abc, and from time intervals 402abc to time intervals 403abc. For example, as shown in FIG. 4, the value of voltage V2 during time intervals 402abc can be greater than the value of voltage V2 during time interval 401a, as indicated by the amplitude of voltage pulse 422 during time intervals 402abc being greater than the amplitude of voltage pulse 421 during time interval 401a. The value of voltage V2 during time interval 403abc can be greater than the value of voltage V2 during time interval 402abc, as indicated by the amplitude of voltage pulse 423 during time interval 403abc being greater than the amplitude of voltage pulse 422 during time interval 402abc.

FIG. 4 shows an example where the write operation of storing information (e.g., storing state 1) in memory cell 201 may include nine voltage pulses (e.g., voltage steps) and nine corresponding current pulses performed in nine corresponding write stages (e.g., performed during time intervals 401abc, 402abc, and 403abc). However, the number of write stages can be different from nine. Thus, the number of voltage and current pulses can be different from nine. The number of verify stages (e.g., which is based on the number of write stages) can also be different from the number of verify stages associated with FIG. 4.

FIG. 4 shows an example where the pulse width of each of voltage pulses 421, 422, and 423 is the same. However, the pulse widths of voltage pulses 421, 422, and 423 can be different. For example, the pulse width of voltage pulse 422 can be greater than the pulse width of voltage pulse 421, and the pulse width of voltage pulse 423 can be greater than the pulse width of voltage pulse 422. Likewise, FIG. 4 shows an example where the pulse width of each of current pulses 411, 412, and 413 is the same. However, the pulse widths of current pulses 411, 412, and 413 can be different. For example, the pulse width of current pulse 412 can be greater than the pulse width of current pulse 411, and the pulse width of current pulse 413 can be greater than the pulse width of current pulse 412.

As described above, the value of current I1 can be increased (e.g., drive current stepping) before the value of voltage V2 is increased (e.g., supply voltage stepping) if the information having a value corresponding to state 1 (e.g., RESET state) is to be stored in memory cell 201 during a write operation. A combination of different voltage values of voltage V2, different current values of current I1, different pulse widths of voltage V2, and different pulse widths of current I1 can be used in the example write operation associated with FIG. 4.

FIG. 5 shows an example of a combination of voltage (e.g., V1 or V2) current (e.g., I0 or I1) and pulse widths having different values during a write operation to store information in memory cell 201 of FIG. 2A. FIG. 5 shows different time intervals, which can include time intervals 501a, 501b, and 501c (also called time intervals 501abc for simplicity), time intervals 502a, 502b, and 502c (also called time intervals 502abc for simplicity), time intervals 503a, 503b, and 503c (also called time intervals 503abc for simplicity), and different time intervals 555. The write operation in the example of FIG. 5 can include write stages that can be performed during respective time intervals 501abc, 502abc, and 503abc. The write stages can be performed to change (e.g., gradually change) the resistance of memory cell 201 to a target resistance value based on the value of information to be stored in memory cell 201. The write operation in the example of FIG. 5 can also include verify stages (write verify stages) that can be performed during respective time intervals 555. The verify stages can be performed to determine (e.g., to verify) whether the resistance of memory cell 201 is within the target resistance value range. As mentioned above, FIG. 5 shows an example where information having a value corresponding to state 0 (e.g., SET state) is assumed to be stored in memory cell 201. Thus, a verify stage performed during each of time intervals 555 can determine whether memory cell 201 is within resistance value range 240 (FIG. 2B), which is the target resistance value range for the example of FIG. 5.

As shown in FIG. 5, voltage pulses 521, 522, and 523 can have the same voltage value (same amplitude) but different pulse widths. Voltage pulses 531, 531, and 533 can have the same voltage value (same amplitude) but different pulse widths. The voltage value of each of voltage pulses 531, 532, and 533 can be greater than the voltage value of each of voltage pulses 521, 522, and 523.

Current pulses 541, 542, and 543 can have the same current value (same amplitude) but different pulse widths. Current pulses 551, 552, and 553 can have the same current value (same amplitude) but different pulse widths. The current value of each of current pulses 551, 552, and 553 can be greater than the current value of each of current pulses 541, 542, and 543.

FIG. 5 shows an example combination of voltage (e.g., V1 or V2) current (e.g., I0 or I1) and pulse widths having different values. However, many combinations of voltage values, current values, and pulse widths can be used. For simplicity, the description herein omits such combinations (e.g., different combinations of supply voltage stepping drive current stepping and pulse width stepping).

The above descriptions with reference to FIG. 1 through FIG. 5 provide techniques for applying a combination (e.g., a mix) of voltage stepping (e.g., supply voltage (V1 or V2) stepping), current (I0 or I1) stepping and pulse width stepping during different operations of a memory device described above (e.g., memory device 100). The techniques described above have improvements and benefits over some conventional techniques. For example, as is known to those skilled in the art, some resistive memory devices can have noticeable snapback and snap forward phenomena in the R-V hysteresis curve. Some conventional techniques have been proposed to handle such phenomena. However, such conventional techniques may not handle such phenomena coherently. The techniques described above (e.g., with reference to FIG. 3 through FIG. 5) can be applied based on whether information to be stored in the memory cell (e.g., memory cell 201) has a value corresponding to state 0 (e.g., SET state) as well as start of RESET when it is in a LRS state or state 1 (e.g., RESET state) as well as start of SET state when it is in a HRS state. Distinguishing between such states (e.g., state 0 or state 1) and start/stop of operation, and then combined with applying voltage stepping current stepping and pulse width stepping in a particular order (e.g., voltage stepping before current stepping or current stepping before voltage stepping) can coherently and smartly handle the mentioned snapback and snap forward phenomena. This leads to an improvement in the accuracy in the write operations of the memory device described above in comparison with some conventional techniques.

Figure 6A:
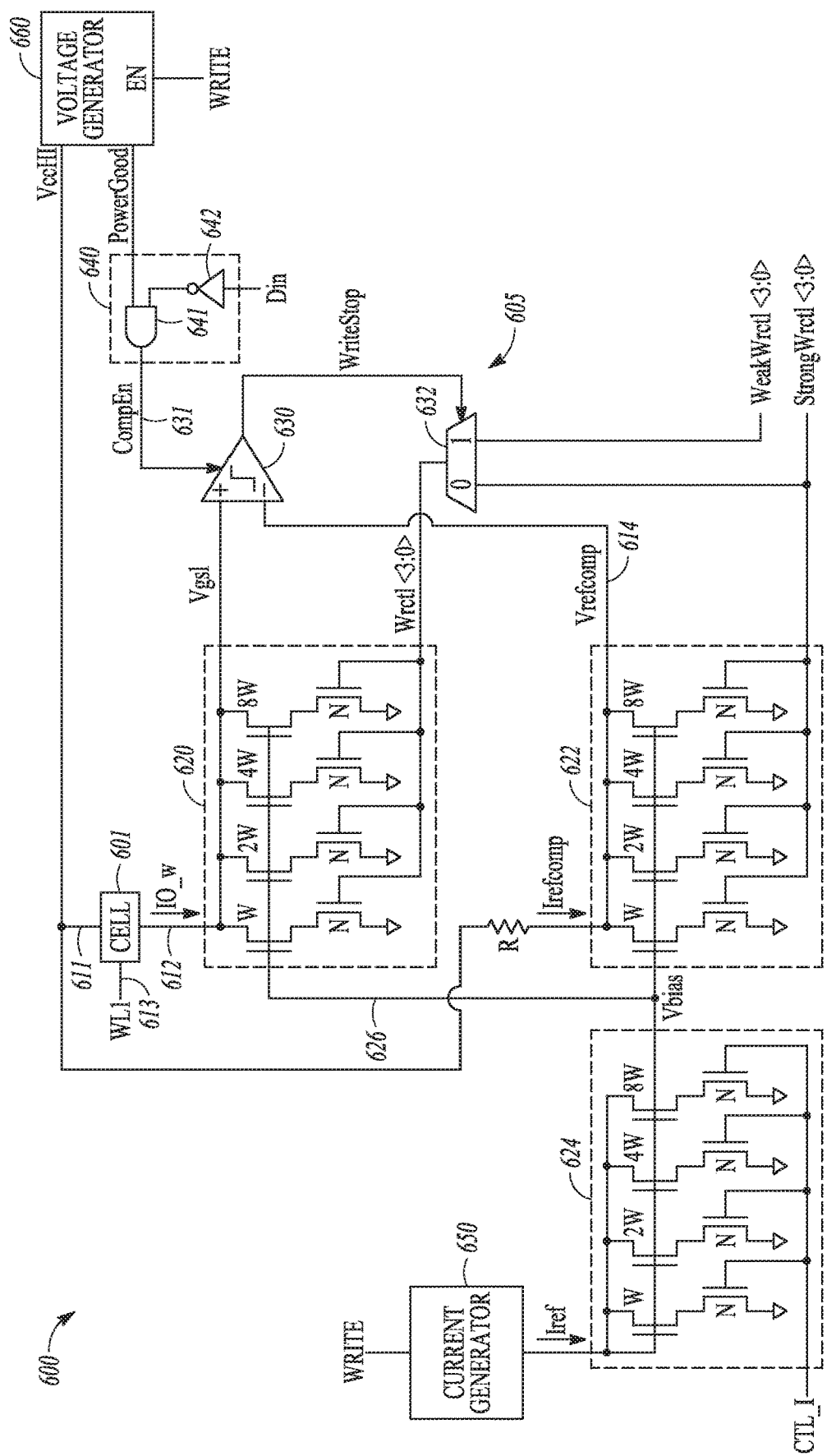
FIG. 6A shows a memory device including write termination circuit, according to some embodiments described herein.

FIG. 6A shows a memory device 600 including write termination circuit 605, according to some embodiments described herein. Memory device 600 includes elements (e.g, control unit, word line decoder, write circuitry, read circuitry, and sense amplifier) similar to those of memory device 100. Such elements (or part of such elements) are not shown in FIG. 6A for simplicity.

As shown in FIG. 6A, memory device 600 can include a memory cell 601, which is one of many memory cells of memory device 600 that are described in detail with reference to FIG. 6B. In FIG. 6A, memory cell 601 can be coupled to conductive lines 611, 612, and 613 (which can carry signal WL1). Memory cell 601 can include elements (e.g., a memory element and a transistor) similar to (or the same as) memory element 201a and transistor T of memory cell 201 of FIG. 2A. Conductive lines 611, 612, and 613 can correspond to conductive lines 211, 212, and 213, respectively, of FIG. 2A.

In FIG. 6A, memory device 600 can include write drivers 620, 622, and 624, a resistor R, a comparator (e.g., a write termination comparator) 630, multiplexer 632, logic circuit 640 including logic gate (e.g, AND gate) 641 and an inverter 642). Logic circuit 640 can generate a signal CompEn on line 631 to enable (or disable) comparator 630.

Memory device 600 can include a current generator 650 that can generate a current (e.g., reference current) Iref, and a voltage generator 660 that can generate a voltage VccHI. Voltage VccHI can be applied to conductive line 611. Voltage generator 660 can include a node to provide a signal PowerGood that can have a value (e.g., PowerGood="0" or "1") indicating whether the value of voltage VccHI reaches a target voltage value (e.g., a predetermined value). The target voltage value can include a voltage value at which comparator 630 can be enabled.

Resistor R can include a precision resistor, such that the value of resistor R can have a small tolerance value (e.g, less than 1% tolerance value). As described in more detail below, resistor R can be used to provide a reference resistance in write termination circuit 605 during a write operation of memory device 600. The value of resistor R can be equal to resistance value LRSmin in FIG. 2B. In this example, resistance value LRSmin can be considered as a reference resistance in write termination circuit 605 during a write operation of memory device 600.

Write driver 620 can operate to provide (e.g., drive) current I0_w through memory cell 601 during a write operation of storing information in memory cell 601. Write driver 620 can be programmable, such that the value of current I0_w can be based on the value of control information (e.g., bits) Wrctl <3:0>, which is either control information (e.g., bits) StrongWrctl <3:0> or control information (e.g., bits) WeakWrctl <3:0>. Each of control information StrongWrctl <3:0> and WeakWrctl <3:0> can include a number of bits (e.g., four bits 0 through 3) to control a corresponding number of transistors N of write driver 620. FIG. 6A shows each of control information StrongWrctl <3:0> and WeakWrctl <3:0> includes four bits as an example. The number of bits can vary. For example, the number of bits of each of control information StrongWrctl <3:0> and WeakWrctl <3:0> can be dependent on (e.g., equal to) the number of transistors N in write driver 622.

As shown in FIG. 6A, write driver 620 can also include transistors W, 2 W, 4 W, and 8 W coupled to respective transistors N of write driver 620 to form parallel current paths between line 612 and ground, in which each of the parallel current paths can be formed by one of transistors W, 2 W, 4 W, and 8 W and one of transistors N between line 612 and ground.

Transistors W, 2 W, 4 W, and 8 W can be binary-weighted transistors and can be selectively turned on (or turned off) by control information Wrctl <3:0> to adjust (e.g., increase or decrease) the value (e.g., the strength) of current I0_w flowing through memory cell 601. FIG. 6A shows an example where the binary weights of transistors W, 2 W, 4 W, and 8 W are 2, 4, 6, and 8, respectively. Thus, the value of current I0_w can be one of 16 current values, depending on which combination of transistors W, 2 W, 4 W, and 8 W is turned on. FIG. 6A shows sixteen programmable (e.g., selectable) values for current I0_w as an example. The number of programmable current values of current I0_w can vary (e.g., can be dependent on the weights, the number, or both of transistors N of write driver 620). Further, FIG. 6A shows binary-weighted transistors W, 2 W, 4 W, and 8 W as an example. Transistors different from binary-weighted transistors can be used.

Control information StrongWrctl <3:0> and control information WeakWrctl <3:0> (e.g., bits) can have different values (different digital values). Control information StrongWrctl <3:0> can cause write driver 620 to provide current I0_w having a greater value (e.g., a stronger current) than control information WeakWrctl <3:0> does. This is useful for a write termination (e.g., described below) where the value (e.g., the strength) of current I-0_w can be reduced after a particular time (e.g., after memory cell 601 reaches a target resistance state) in an operation of storing information in memory cell 601.

Write driver 622 can operate as a replica of write driver 620 to drive current Irefcomp through resistor R. As shown in FIG. 6A, write driver 622 can include elements that are similar (or identical) to the elements of write driver 620. For example, write driver 622 can include transistors N and transistors W, 2 W, 4 W, and 8 W. The value of current Irefcomp can be dependent on the value of information StrongWrctl <3:0> which is used to control (e.g., turn on or turn off) any combination of transistors W, 2 W, 4 W, and 8 W.

Write driver 624 can be coupled to write drivers 620 and 622 through line 626 (which can carry a bias signal Vbias). Write driver 624 can be configured as a current mirror, such that currents I0_w and Irefcomp provided (e.g., driven) by respective write drivers 620 and 622 can be based on current Iref received at write driver (e.g., current mirror) 624. Write driver 624 can include elements that are similar (or identical) to the elements of write driver 620. For example, write driver 624 can include transistors N and transistors W, 2 W, 4 W, and 8 W. The value of current Iref can be dependent on the value of control information CTL_I <3:0> which is used to control (e.g., turn on or turn off) any combination of transistors W, 2 W, 4 W, and 8 W of write driver 624. Control information CTL_I <3:0> can be programmable, such that control information (e.g, bits) CLT_I <3:0> can have value to select the value of current Iref.

Current generator 650 can be an on-chip current generator, such that current generator 650 and memory cell 601 can be located on the same chip (e.g, same semiconductor die). Voltage generator 660 can include a charge pump (not shown), which can be an on-chip charge pump, such that the charge pump and memory cell 601 can be located on the same chip. Current generator 650 and voltage generator 660 can receive a signal WRITE, which can be activated (e.g, asserted) during a write operation performed on memory cell 601 to store information on memory cell 601. Signal WRITE can have a value (e.g, "high" or a value corresponding to "1") to enable (e.g, turn on) current generator 650 and voltage generator 660. Signal WRITE can have another value (e.g, "low" or a value corresponding to "0") to disable (e.g, turn off) current generator 650 and voltage generator 660. Voltage VccHI can have different values during a write operation performed on memory cell 601. The value of information Din can be based on (e.g, can correspond to) the value of information (e.g, "0" or "1") to be stored in memory cell 601. FIG. 6A shows an example where driver 620 is implemented using a current mirror arrangement. However, a full Vgs write driver may be used, such that the write driver can be biased by a voltage equal to a supply voltage (e.g, Vcc) of memory device 600.

The following description describes a part of an example operation of memory device 600 where information having a value of "0" (which can correspond to state 0, similar to state 0 in FIG. 2B) is to be stored in memory cell 601. Thus, in this example, Din="0" and memory cell 601 reaches its target resistance state when the resistance value of memory cell 601 reaches a resistance value corresponding to resistance value LRSmin of FIG. 2B (e.g, target resistance value=LRSmin=R).

In operation, when voltage VccHI reaches a target voltage (e.g, a predetermined voltage) after signal WRITE is activated (e.g, WRITE="1"), voltage generator 660 asserts signal PowerGood (e.g, by changing the value of signal PowerGood from "0" to "1"). When PowerGood="1" and Din="0", logic circuit 640 can cause signal CompEn to change to value of "1" and enables comparator 630. When comparator 630 is enabled, it begins comparing voltage Vgsl (on conductive line 612 coupled to an input node of comparator 630) with voltage Vrefcomp on conductive line 614 (which is coupled to another input node of comparator 630). At the beginning of the write operation, the resistance of memory cell 601 (e.g, resistance between conductive lines 611 and 612) can be much higher than the resistance of resistor R. Thus, voltage Vgsl has a value less than the value of voltage Vrefcomp (Vgl<Vrefcomp). This causes comparator 630 to change the value of signal WriteStop at the output node of comparator 630, such that WriteStop="0". The output node of comparator 630 (that carries signal WriteStop) is coupled to a select node (e.g, control node) of multiplexer 632. When WriteStop="0", it causes multiplexer 632 to select StrongWrctl <3:0> to its output, such that WrCtl <3:0>=StrongWrctl <3:0>.

When the value of the resistance of memory cell 601 is less than the resistance of resistor R, the value of voltage Vgsl can be greater than the value of voltage Vrefcomp. This causes comparator 630 to change the value of signal WriteStop, such that WriteStop="1". When WriteStop="1", multiplexer 632 selects WeakWrctl <3:0> to its output, such that WrCtl <3:0>=WeakWrctl <3:0>. This causes the value (e.g, the strength) of current I0_w through memory cell 601 to be either reduced to a lower level (e.g, I0_w>0 but level lower than the level when Wrctl=StrongWrctl <3:0>). Alternatively, the value of WeakWrctl <3:0> can be selected (e.g, programmed) such that the value (e.g, the strength) of current I0_w through memory cell 601 can be turned off (e.g, I0_w=0). Thus, the value of current I0_w can be controlled (e.g, by controlling the value of control information WeakWrctl <3:0>), such that the value of current I0_w may not immediately go to zero when memory cell 601 reaches a target resistance state corresponding to state 0. After Wrctl=WeakWrctl <3:0>, current generator 650 and voltage generator 660 can be turned off when signal WRITE="0".

As described above, multiplexer 632 can operate to provide control information StrongWrctl <3:0> to write driver 620 before the value of the resistance of the memory cell 601 is less than the resistance value (e.g, reference resistance value=LRSmin) of resistor R. This causes current I0_w to have a value based on control information StrongWrctl <3:0>. Multiplexer 632 can also operate to provide control information WeakWrctl <3:0> to write driver 620 after the value of the resistance of the memory cell 601 is less than the resistance value (e.g, reference resistance value=LRSmin) of resistor R. This causes current I0_w to have a value based on control information WeakWrctl <3:0>.

Thus, as described above, using control information StrongWrctl <3:0> allows a maximum strength write driver biased to full supply voltage (e.g, VccHI). For example, the techniques described above can provide a relatively higher voltage of pre-switching drive at the beginning of an operation (e.g, "SET" operation) of storing information in memory cell 601 (or alternatively a "FORM" operation). With separate control information StrongWrctl <3:0> and WeakWrctl <3:0>, write driver 620 can be programmed to full strength (e.g, by using StrongWrctl <3:0>) before memory cell 601 reaches its target resistance value (e.g, before "SET" operation stops). Write driver 620 can also be programmed to be completely turned off or weakly turned on (e.g, by using WeakWrctl <3:0>) after memory cell 601 reaches its target resistance value (e.g, after "SET" operation stops). Keeping write driver 620 weakly turned on (e.g, to limit the drive current provided to memory cell 601) after memory cell 601 reaches its target resistance value (e.g, resistance LRSmin) can prevent relaxation of memory cell 601, thereby avoiding a situation where memory cell 601 may go from a target resistance value (e.g, LRS value range) back to HRS range (e.g, resistance of memory cell 601 before the write operation). Including resistor R (e.g, precision resistor R=LRSmin) allows memory device 600 to track the value of voltage Vgsl relative to different values of voltage VccHI (VccHI steps) in different verify stages performed on memory cell 601 in different conditions (e.g, initializing (e.g, "forming") condition and SET conditions). Including signal PowerGood as described above can minimize the time before the signal CompEn is valid. Voltage VccHI can be provided to the entire sub-array circuitry (e.g, write path, read path, sense amplifier, verify logic circuitry, word line driver, and replica write driver paths) of memory device 600. Alternatively, voltage VccHI can be selectively provided to a portion of the sub-array circuitry (e.g, only provided to the write path of memory device 600).

The above description describes a write termination (e.g, SET write termination) being performed during storing of information having a value corresponding to "0" (e.g, SET/ FORMING state) in memory cell 601. However, the write termination can also be applicable to a RESET termination during an operation of storing of information having a value corresponding "1" (e.g, RESET state) in memory cell 601.

For example, write termination circuit 605 can be alternatively configured such that a comparator similar to comparator 630 can be enabled to change the strength of the drive current used the RESET termination after the value of the resistance of the memory cell 601 is greater than the resistance value (e.g, reference resistance value=HRSmax) of resistor R.

Figure 6B:
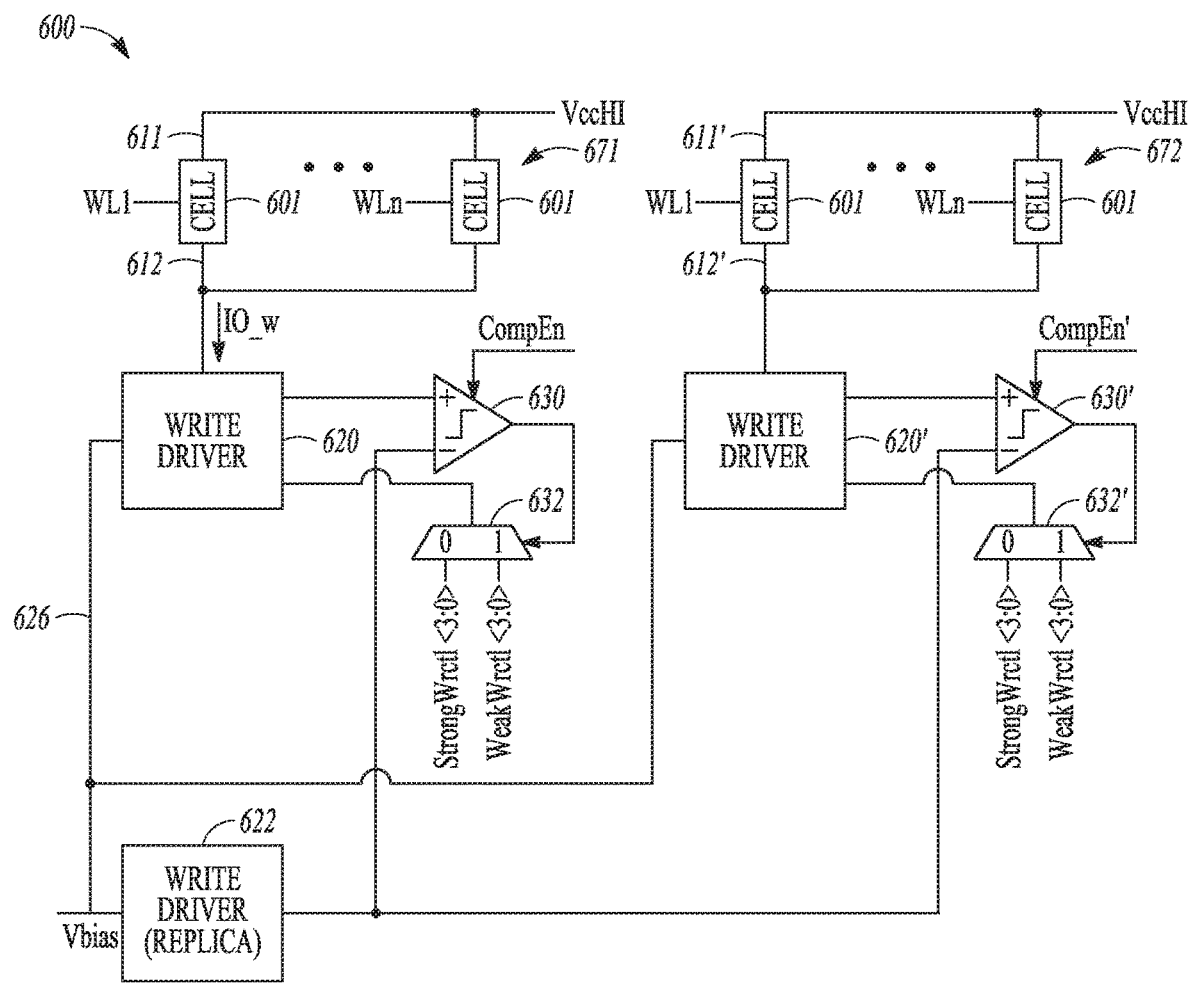
FIG. 6B shows the memory device of FIG. 6A including memory cells arranged in groups, according to some embodiments described herein.

FIG. 6B shows memory device 600 of FIG. 6A including memory cells arranged in groups 671 and 672, according to some embodiments described herein. A portion of memory device 600 of FIG. 6A is also shown in FIG. 6B. For simplicity, description of the same elements shown in FIG. 6A are not repeated in FIG. 6B.

As shown in FIG. 6B, each of groups 671 and 672 (e.g, memory cell columns) can include multiple memory cells 601. Memory cells 601 of group 671 can be coupled to (e.g, can share) conductive lines 611 and 612. Memory cells 601 of group 672 can be coupled to (e.g, can share) conductive lines 611' and 612'. Each of memory cells 601 in memory cell group 671 can be accessed by one of signals WL1 and WLn. Memory cell groups 671 and 672 can share signals WL1 through WLn.

As shown FIG. 6B, memory device 600 can include write driver 620', which can include elements (e.g, transistors N and transistors W, 2 W, 4 W, and 8 W) similar to or identical to those of write driver 620 of FIG. 6A. Write driver 620 can be shared by memory cells 601 of memory cell group 671. Write driver 620' can be shared by memory cells 601 of memory cell group 672. Write driver 620' can be coupled to line 626 (which can carry signal Vbias) such that write drivers 620 and 620' can share write driver (e.g, replica write driver) 622.

Memory device 600 can include a comparator 630' and a multiplexer 632' associated with memory cell group 672. Comparator 630' can be enabled by a signal CompEn', which can be generated by a logic circuit (not shown but can be similar to logic circuit 640 (FIG. 6A)). Multiplexer 632' can receive control information StrongWrctl <3:0> and WeakWrctl <3:0>. Comparator 630' and multiplexer 632' can operate in way s similar to those of comparator 630 and multiplexer 632, respectively. For example, during write operation performed on one of memory cells 601 of group 672, of comparator 630 and multiplexer 632 can operate to adjust (e.g, decrease) the drive strength of write driver 620' after the selected memory cell (among memory cells 601 of group 672) reaches a target resistance value.

Thus, as shown in FIG. 6B, each of groups 671 and 672 can have a dedicated comparator (e.g, comparator 630 or 630') and a dedicated multiplexer (e.g, multiplexer 632 or 632'). Therefore, selection of WeakWrctl <3:0> (e.g, after the memory cell reaches a target resistance value) during an operation performed on a selected memory cell in each of groups 671 and 672 can be done at different times for each of groups 671 and 672.

FIG. 7 shows a memory device 700 including a variable resistor 705 and resistor control circuitry 706, according to some embodiments described herein. Memory device 700 includes elements (e.g, control unit, word line decoder, write circuitry, and read circuitry) similar to those of memory device 100 (FIG. 1) and memory device 600 (FIG. 6). Such elements (or part of such elements) are not shown in FIG. 7 for simplicity.

As shown in FIG. 7, memory device 700 can include data lines (e.g, bit lines) 711 and 711', memory cells 701.1 through 701.n coupled to data line 711, and memory cells 701.1' through 701.n' coupled to data line 711'. Memory device 700 can selectively access memory cells 701.1 through 701.n and 701.1' through 701.n' using respective signals (e.g, word line signals) WL1 through WLn and WL1' through WLn'. For simplicity, memory cells 701.1 through 701.n and 701.1' through 701.n' are collectively referred to as the memory cells of memory device 700.

During a read operation, memory device 700 can use data lines 711 and 711' to read (e.g, sense) information stored in a selected memory cell among memory cells 701.1 through 701.n. During a verify stage of a write operation to store information in a selected memory cell among memory cells 701.1 through 701.n, memory device 700 can use data lines 711 and 711' to verify (e.g, determine) whether the resistance of the selected memory cell is within a target resistance value range.

As shown in FIG. 7, memory device 700 can include a sense amplifier 721, a logic gate (e.g, exclusive OR gate) 723, and a write driver 725. Sense amplifier 721 includes input nodes coupled to data lines 711 and 711'. Sense amplifier 721 can operate during a read operation or during a verify stage of a write operation to sense information from the selected memory cell based on signals (e.g, voltage signals) on data lines 711 and 711' to generate information Dout. Information Dout can have a value (e.g, Dout="0" or Dout="1") based on the values of signals on data lines 711 and 711'. Thus, information Dout can represent information sensed from a selected memory cell (among the memory cells of memory device 700) during a read operation or during a verify stage of a write operation.

Write driver 725 can be enabled (e.g, turned on) during a write operation to provide a current (e.g, write current (e.g, similar to currents I0 or I1 in FIG. 2B and FIG. 2C)) through a selected memory cell among the memory cells of memory device 700. Write driver 725 can be disabled (e.g, turned off) when the resistance of the selected memory cell is within a target resistance value range (e.g, within resistance value range 240 or 241 of FIG. 2B). A signal (e.g, write driver enable signal) EN can be used to control (e.g, enable or disable) write driver 725.

Logic gate 723 can operate to generate signal EN based on information Din and information Dout. Information Din can be based on information to be stored in a selected memory cell (among the memory cells of memory device 700) during a write operation. Logic gate 723 can operate such that signal EN can have one value (e.g, EN="1") if information Din and Dout have different values (e.g, Din Dout) and another value (e.g, EN="0") if information Din and Dout have the same value (e.g, Din=Dout)

For example, during a verify stage of a write operation to store information in a selected memory cell, EN="1" when the resistance of the selected memory cell is outside a target resistance value range. Write driver 725 can remain enabled (e.g, remain turned on) if EN="1". In another example, during a verify stage of a write operation to store information in a selected memory cell, EN="0" when the resistance of the selected memory cell is within a target resistance value range. Write driver 725 can be disabled (e.g, turned off) if EN="0".

Variable resistor 705 can include a precision variable resistor that can be controlled by resistor control circuitry 706 to provide different resistances at different times, depending on which operation memory device 700 operates. For example, variable resistor 705 can be controlled to provide different resistances during a read operation to read information from a selected memory cell (e.g, among memory cells 701.1 through 701.n). Variable resistor 705 can also be controlled during a verify stage of a write operation to store information in a selected memory cell (e.g, among memory cells 701.1 through 701.n). In this example write operation where one memory cells 701.1 through 701.n of memory cell is selected, memory cells 701.1' through 701.n' can serve to cancel current leakage (e.g, column leakage) in an open bit line type of architecture, such as the structure of memory device 700.

During a read operation, variable resistor 705 can have a value similar to or the same as resistance READ_th in FIG. 2B to allow sense amplifier 721 to determine the value of information stored in (previously stored in) the selected memory cell.

During a verify stage, variable resistor 705 can have a value similar to or the same as resistance LRSmax in FIG. 2B if information to be stored in the selected memory cell has a value corresponding to state 0 (e.g, corresponding to a resistance value within resistance value range 240 in FIG. 2B)

During a verify stage, variable resistor 705 can have a value, e.g, resistance HRSmin in FIG. 2B, if information to be stored in the selected memory cell has a value corresponding to state 1 (e.g, corresponding to a resistance value within resistance value range 241 in FIG. 2B).

Resistor control circuitry 706 can operate to cause variable resistor 705 to have different resistances (as mentioned above), depending on whether memory device 700 performs a read operation or a verify stage of a write operation. As shown in FIG. 7, resistor control circuitry 706 can include a multiplexer 730, a decoder 732, and a logic circuit (e.g, pass transistor logic circuit) 734. Multiplexer 730 can have a select input to receive a signal SEL_Verify/Read. The value of signal SEL_Verify/Read can indicate whether memory device 700 performs a read operation on a selected memory cell (e.g, among memory cells 701.1 through 701.n) or a verify stage of a write operation on the selected memory cell. For example, SEL_Verify/Read="1" can indicate a verify stage is being performed, and SEL_Verify/Read="0" can indicate a read operation is being performed.

Control information CTLread (e.g, digital information) can have a value (e.g, a combination of bits) to allow resistor control circuitry 706 to cause variable resistor 705 to provide (e.g, to have) a resistance that can have a value similar to or the same as resistance value READ_th in FIG. 2B.

Control information CTLverify (e.g, digital information) can have a value (e.g, a combination of bits) to allow resistor control circuitry 706 to cause variable resistor 705 to provide (e.g, to have) a resistance that can have a value similar to or the same as resistance value LRSmax FIG. 2B if Din="0". Din="0" can indicate that information having a value of "0" (e.g, state 0 (or SET state) in FIG. 2B) is to be stored in the selected memory cell. The value (e.g, a combination of bits) of control information CTLverify can also allow control circuitry 706 to cause variable resistor 705 to provide (e.g, to have) a resistance that can have a value similar to or the same as resistance value HRSmin FIG. 2B if Din="1". Din="1" can indicate that information having a value of "1" (e.g, state 1 (or RESET state) in FIG. 2B) is to be stored in the selected memory cell.

Control information CTLread and control information CTLverify can be programmable information, such that the value of control information CTLread, the value of control information CTLverify, or both can be different from one memory device (e.g, memory device 700) to another memory device, depending on which combination of values provides more accuracy in the sensing operation of memory device 700.

Decoder 732 can operate to decode control information CTL (output control information from multiplexer 730), which can be either control information CTLverify or control information CTLread selected by multiplexer 730 based on signal SEL_Verify/Read. Decoder 732 can generate control information (e.g, decoded control information) CTL_R based on the decoding of control information CTL and information Din. Information CTL_R can have value corresponding to different values (or a different range of values) that variable resistor 705 can provide.

Logic circuitry 734 can operate to receive control information CTL_R and generate control information SEL_R (based on control information CTL_R) to cause the variable resistor 705 to provide a resistance based on control information SEL_R. As an example, the resistance provided by variable resistor 705 based on information SEL_R can be threshold resistance value READ_th, resistance LRSmax, or resistance HRSmin, depending on which operation (e.g, read or verify) memory device 700 performs.

The above description with reference to FIG. 7 provides techniques for using a single variable resistor (e.g, variable resistor 705) for different operations (e.g, read and verify) of memory device 700. The techniques described above have improvements and benefits over some conventional techniques. For example, some conventional techniques may suffer from process variations that may result in poor placement of a reference path for sensing (e.g, read and verify) operations performed on a selected memory cell. In the techniques described above with reference to FIG. 7, using a precision variable resistor (e.g, variable resistor 705) allows a relatively higher accuracy in the placement of a reference path (e.g, a path going through variable resistor 705) for sensing (e.g, read and verify) operations performed on a selected memory cell of memory device 700. This leads to an improvement in the sensing operations of memory device 700 in comparison to some conventional techniques. Further, since control information CTLread and control information CTLverify can be programmable, variable resistor 705 and resistor control circuitry 706 can be tuned independently in different memory devices (e.g, different dies) to provide optimal sensing operations for each memory device that includes variable resistor 705 and resistor control circuitry 706.

The above description with reference to FIG. 1 through FIG. 7 provides different apparatuses and techniques to improve operations of a resistive memory device. The apparatuses and techniques described above can be combined in any combination. For example, the apparatuses and technique described above with reference to FIG. 2A through FIG. 5 can be combined with the apparatuses and techniques described above with reference to FIG. 6A and FIG. 6A, the apparatuses and techniques described above with reference to FIG. 7, or both the apparatuses and techniques described above with reference to FIG. 6A through FIG. 7.

Figure 8:
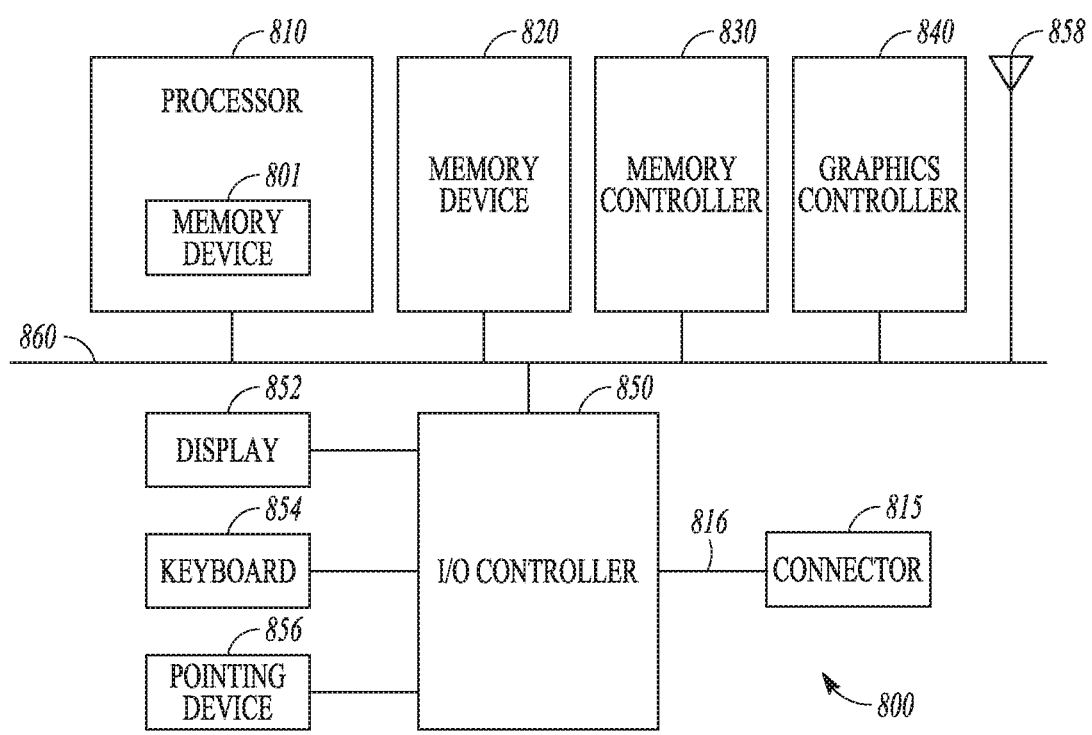
FIG. 8 shows an apparatus in the form of a system (e.g, electronic system), according to some embodiments described herein.

FIG. 8 shows an apparatus in the form of a system (e.g, electronic system) 800, according to some embodiments described herein. System 800 can include or be included in a computer, a tablet, or other electronic systems. As shown in FIG. 8, system 800 can include a processor 810, a memory device 820, a memory controller 830, a graphics controller 840, an input/output (I/O) controller 850, a display 852, a keyboard 854, a pointing device 856, at least one antenna 858, a connector 815, and a bus 860 (e.g, conductive lines formed on a circuit board (not shown) of system 800).

Each of processor 810, memory device 820, memory controller 830, graphics controller 840, and I/O controller 850 can include an IC chip.

In some arrangements, system 800 does not have to include a display. Thus, display 852 can be omitted from system 800. In some arrangements, system 800 does not have to include any antenna. Thus, antenna 858 can be omitted from system 800.

Processor 810 can include a general-purpose processor or an application specific integrated circuit (ASIC). Processor 810 can include a central processing unit (CPU).

Memory device 820 can include a dynamic random-access memory (DRAM) device, a static random access memory (SRAM) device, a flash memory device, phase change memory, a combination of these memory devices, or other types of memory. FIG. 8 shows an example where memory device 820 is a stand-alone memory device separated from processor 810. In an alternative arrangement, memory device 820 and processor 810 can be located on the same die. In such an alternative arrangement, memory device 820 is an embedded memory in processor 810, such as embedded DRAM (eDRAM), embedded SRAM (eS-RAM), embedded non-volatile memory (embedded flash memory), or another type of embedded memory.

Display 852 can include a liquid crystal display (LCD), a touchscreen (e.g., capacitive or resistive touchscreen), or another type of display. Pointing device 856 can include a mouse, a stylus, or another type of pointing device.

I/O controller 850 can include a communication module for wired or wireless communication (e.g., communication through one or more antennas 858). Such wireless communication may include communication in accordance with WiFi communication technique, Long Term Evolution Advanced (LTE-A) communication technique, or other communication techniques.

I/O controller 850 can also include a module to allow system 800 to communicate with other devices or systems in accordance with one or more of the following standards or specifications (e.g., I/O standards or specifications), including Universal Serial Bus (USB), Display Port (DP), High-Definition Multimedia Interface (HDMI), Thunderbolt, Peripheral Component Interconnect Express (PCIe), Ethernet, and other specifications.

Connector 815 can be arranged (e.g., can include terminals, such as pins) to allow system 800 to be coupled to an external device (or system). This may allow system 800 to communicate (e.g., exchange information) with such a device (or system) through connector 815. Connector 815 may be coupled to I/O controller 850 through a connection 816 (e.g., a bus).

Connector 815, connection 816, and at least a portion of bus 860 can include elements (e.g., conductive terminals, conductive lines, or other conductive elements) that conform with at least one of USB, DP, HDMI, Thunderbolt, PCIe, Ethernet, and other specifications.

FIG. 8 shows the elements (e.g., devices and controllers) of system 800 arranged separately from each other as an example. For example, each of processor 810, memory device 820, memory controller 830, graphics controller 840, and I/O controller 850 can be located on a separate IC chip (e.g., separate semiconductor dies). In some arrangements, two or more elements (e.g., processor 810, memory device 820, graphics controller 840, and I/O controller 850) of system 800 can be located on the same die (e.g., same IC chip) that can form a system-on-chip (SoC).

One or more of processor 810, memory device 820, memory controller 830, graphics controller 840, and I/O controller 850 can include the memory devices described above with reference to FIG. 1 through FIG. 7. As an example, FIG. 8 shows processor 810 including a memory device (e.g., embedded memory device) 801, which can be used as cache memory for processor 810. Memory device 801 can include memory device 100 (FIG. 1), memory device 600 (FIG. 6), or memory device 700 (FIG. 7). Thus, memory device 801 can include memory cells (e.g., resistive memory cell 101, 201, 601, 701.1 through 701.n, or 701.1' through 701.n') and memory operations (e.g., read and write operations) similar to (or the same as) memory operations of memory device 100, 600, or 700 and operations described above with reference to FIG. 1 through FIG. 7. Although not shown in FIG. 8, one or more of memory device 820, memory controller 830, graphics controller 840, and I/O controller 850 can include memory device 801.

The illustrations of the apparatuses (e.g., memory devices 100, 600, and 700, and system 800) and methods (e.g., memory devices 100, 600, and 700, and system 800) described above with reference to FIG. 1 through FIG. 8 are intended to provide a general understanding of the structure of different embodiments and are not intended to provide a complete description of all the elements and features of an apparatus that might make use of the structures described herein.

The apparatuses (e.g., memory devices 100, 600, and 700, and system 800) described herein may include or be included in electronic circuitry, such as high-speed computers, communication and signal processing circuitry, single or multi-processor modules, single or multiple embedded processors, multi-core processors, message information switches, and application-specific modules including multi-layer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, smart cards, Internet of Things (IoT), and others.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

ADDITIONAL NOTES AND EXAMPLES

Example 1 includes subject matter (such as a device, an electronic apparatus (e.g., circuit, electronic system, or both), or a machine) including a first conductive line, a second conductive line, a resistive memory cell coupled between the first and second conductive lines, and a control unit to cause a voltage at the first conductive line during a first time interval and a second time interval of an operation of changing a resistance of the resistive memory cell to have a first voltage value during the first time interval and a second voltage value during the second time interval, the second voltage value being greater than the first voltage value, and to cause a current flowing through the resistive memory cell during the first and second time intervals to remain unchanged at a first current value, and cause a voltage at the first conductive line during a third time interval and a fourth time interval of the operation to have a third voltage value during the third time interval and a fourth voltage value during the fourth time interval, the fourth voltage value being greater than the third voltage value, and to cause a current flowing through the resistive memory cell during the third and fourth time intervals to remain unchanged at a second current value, the second current value being greater than the first current value.

In Example 2, the subject matter of Example 1 may optionally include, wherein the resistive memory cell has a first resistance before the first time interval and a second resistance after the fourth time interval, and the second resistance has a resistance value is less than a resistance value of the first resistance.

In Example 3, the subject matter of Example 1 or 2 may optionally include, wherein the control unit is to perform an operation of changing a value of a drive current applied to the resistive memory cell after the resistance of the resistive memory cell reaches a target resistance value.

In Example 4, the subject matter of Example 1 may optionally include, further comprising a variable resistor coupled to the first conductive line.

In Example 5, the subject matter of Example 1 may optionally include, wherein the control unit is to perform a first verify stage between the first and second time intervals to determine whether the resistive memory cell is within a target resistance value range, perform a second verify stage between the second and third time intervals to determine whether the resistive memory cell is within the target resistance value range, and perform a third verify stage between the third and fourth time intervals to determine whether the resistive memory cell is within the target resistance value range.

In Example 6, the subject matter of Example 1 may optionally include, wherein the first voltage value is based on an amplitude of a first voltage pulse, the second voltage value is based on an amplitude of a second voltage pulse, and the first and second voltage pulses have different pulse widths.

In Example 7, the subject matter of Example 1 or 6 may optionally include, wherein the first current value is based on an amplitude of a first current pulse, the second current value is based on an amplitude of a second current pulse, and the first and second current pulses have different pulse widths.

Example 8 includes subject matter (such as a device, an electronic apparatus (e.g, circuit, electronic system, or both), or a machine) including a first conductive line, a second conductive line, a resistive memory cell coupled between the first and second conductive lines, and a control unit to cause a current flowing through the resistive memory cell during a first time interval and a second time interval of an operation of storing information in the resistive memory cell to have a first current value during the first time interval and a second current value during the second time interval, the second current value being greater than the first current value, and to cause a voltage at the first conductive line during the first and second time intervals to remain unchanged at a first voltage value, and cause a current flowing the resistive memory cell during a third time interval and a fourth time interval of the operation to have a third current value during the third time interval and a fourth current value during the fourth time interval, the fourth current value being greater than the third current value, and to cause a voltage at the first conductive line during the third and fourth time intervals to remain unchanged at a second voltage value, the second voltage value being greater than the first voltage value.

In Example 9, the subject matter of Example 8 may optionally include, wherein the resistive memory cell has a first resistance before the first time interval and a second resistance after the fourth time interval, and the second resistance has a resistance value that is greater than a resistance value of the first resistance.

In Example 10, the subject matter of Example 8 may optionally include, wherein the control unit is to perform a first verify stage between the first and second time intervals to determine whether the resistive memory cell is within a target resistance value range, perform a second stage between the second and third time intervals to determine whether the resistive memory cell is within the target resistance value range, and perform a third verify stage between the third and fourth time intervals to determine whether the resistive memory cell is within the target resistance value range.

In Example 11, the subject matter of Example 8 may optionally include, wherein the first current value is based on an amplitude of a first current pulse, the second current value is based on an amplitude of a second current pulse, and the first and second current pulses have different pulse widths.

In Example 12, the subject matter of Example 8 or 11 may optionally include, wherein the first voltage value is based on an amplitude of a first voltage pulse, the second voltage value is based on an amplitude of a second voltage pulse, and the first and second voltage pulses have different pulse widths.

Example 13 includes subject matter (such as a device, an electronic apparatus (e.g, circuit, electronic system, or both), or a machine) including a first conductive line, a second conductive line, a resistive memory cell coupled between the first and second conductive lines, a driver to drive a first current and a second current through the resistive memory cell during an operation of changing a resistance of the resistive memory cell, the first current having a first value, and the second current having a second value less than the first value, and a multiplexer to provide first control information to the driver before a value of the resistance of the resistive memory cell reaches a reference resistance value to cause the first current to have the first value based on the first control information, and to provide second control information to the driver after the value of the resistance of the resistive memory cell reaches the reference resistance value to cause the second current to have the second value based on the second control information.

In Example 14, the subject matter of Example 13 may optionally include, further comprising a resistor coupled between the first conductive line and a third conductive line, and an additional driver coupled to the third conductive line.

In Example 15, the subject matter of Example 13 may optionally include, wherein comprising a comparator including input nodes coupled to the second and third conductive lines, and an output node coupled to a select node of the multiplexer.

In Example 16, the subject matter of Example 13 may optionally include, further comprising a voltage generator to provide a voltage to the first conductive line, the voltage generator including a node to provide a signal indicating whether the voltage on the first conductive line reaches a target voltage value.

In Example 17, the subject matter of Example 13 may optionally include, wherein the resistor has a resistance value based on a resistance value range of the resistive memory cell.

In Example 18, the subject matter of Example 13 may optionally include, wherein the driver includes a current mirror.

In Example 19, the subject matter of Example 13 may optionally include, wherein the driver includes current paths coupled in parallel between the second conductive line and ground.

In Example 20, the subject matter of Example 13 may optionally include, wherein the driver is to be biased by a voltage equal to a supply voltage of a memory device that includes the resistive memory cell.

In Example 21, the subject matter of Example 13 may optionally include, further comprising an additional resistive memory cell, an additional write driver coupled to the additional resistive memory cell, an additional comparator coupled to the additional write driver, and an additional multiplexer coupled to the additional comparator.

Example 22 includes subject matter such as a device, an electronic apparatus (e.g, circuit, electronic system, or both), or a machine) including a first data line and first resistive memory cells coupled to the first data line, a second data line and second resistive memory cells coupled to the second data line, a sense amplifier including a first input node coupled to the first data line, and a second input node coupled to the second data line, and a variable resistor coupled to the second input node of the sense amplifier.

In Example 23, the subject matter of Example 22 may optionally include, further comprising resistor control circuitry to cause the variable resistor to provide a first resistance during a verify stage of an operation of storing information in one of the first resistive memory cells, and to cause the variable resistor to provide a second resistance during a read operation performed on one of the first resistive memory cells.

In Example 24, the subject matter of Example 22 may optionally include, further comprising resistor control circuitry to cause the variable resistor to provide a first resistance and a second resistance based on a first control information, and to cause the variable resistor to provide a second resistance based on a second control information.

In Example 25, the subject matter of Example 22 may optionally include, wherein the resistor control circuitry includes a multiplexer to provide output control information based on a first control information and a second control information, a decoder to decode the output control information to generate decoded control information, and a logic circuit to cause the variable resistor to provide a resistance based on the decoded control information.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a first conductive line;
a second conductive line;
a resistive memory cell coupled between the first and second conductive lines; and
a control unit to:
cause a voltage at the first conductive line during a first time interval and a second time interval of an operation of changing a resistance of the resistive memory cell to have a first voltage value during the first time interval and a second voltage value during the second time interval, the second voltage value being greater than the first voltage value, and to cause a current flowing through the resistive memory cell during the first and second time intervals to remain unchanged at a first current value; and
cause a voltage at the first conductive line during a third time interval and a fourth time interval of the operation to have a third voltage value during the third time interval and a fourth voltage value during the fourth time interval, the fourth voltage value being greater than the third voltage value, and to cause a current flowing through the resistive memory cell during the third and fourth time intervals to remain unchanged at a second current value, the second current value being greater than the first current value.

2. The apparatus of claim 1, wherein the resistive memory cell has a first resistance before the first time interval and a second resistance after the fourth time interval, and the second resistance has a resistance value is less than a resistance value of the first resistance.

3. The apparatus of claim 1, wherein the control unit is to perform an operation of changing a value of a drive current applied to the resistive memory cell after the resistance of the resistive memory cell reaches a target resistance value.

4. The apparatus of claim 3, further comprising a variable resistor coupled to the first conductive line.

5. The apparatus of claim 1, wherein the control unit is to:
perform a first verify stage between the first and second time intervals to determine whether the resistive memory cell is within a target resistance value range;
perform a second verify stage between the second and third time intervals to determine whether the resistive memory cell is within the target resistance value range; and
perform a third verify stage between the third and fourth time intervals to determine whether the resistive memory cell is within the target resistance value range.

6. The apparatus of claim 1, wherein the first voltage value is based on an amplitude of a first voltage pulse, the second voltage value is based on an amplitude of a second voltage pulse, and the first and second voltage pulses have different pulse widths.

7. The apparatus of claim 1, wherein the first current value is based on an amplitude of a first current pulse, the second current value is based on an amplitude of a second current pulse, and the first and second current pulses have different pulse widths.

8. An apparatus comprising:
a first conductive line;
a second conductive line;
a resistive memory cell coupled between the first and second conductive lines; and
a control unit to:
cause a current flowing through the resistive memory cell during a first time interval and a second time interval of an operation of storing information in the resistive memory cell to have a first current value during the first time interval and a second current value during the second time interval, the second current value being greater than the first current value, and to cause a voltage at the first conductive line during the first and second time intervals to remain unchanged at a first voltage value; and
cause a current flowing the resistive memory cell during a third time interval and a fourth time interval of the operation to have a third current value during the third time interval and a fourth current value during the fourth time interval, the fourth current value being greater than the third current value, and to cause a voltage at the first conductive line during the third and fourth time intervals to remain unchanged at a second voltage value, the second voltage value being greater than the first voltage value.

9. The apparatus of claim 8, wherein the resistive memory cell has a first resistance before the first time interval and a second resistance after the fourth time interval, and the second resistance has a resistance value that is greater than a resistance value of the first resistance.

10. The apparatus of claim 8, wherein the control unit is to:
perform a first verify stage between the first and second time intervals to determine whether the resistive memory cell is within a target resistance value range;
perform a second stage between the second and third time intervals to determine whether the resistive memory cell is within the target resistance value range; and
perform a third verify stage between the third and fourth time intervals to determine whether the resistive memory cell is within the target resistance value range.

11. The apparatus of claim 8, wherein the first current value is based on an amplitude of a first current pulse, the second current value is based on an amplitude of a second current pulse, and the first and second current pulses have different pulse widths.

12. The apparatus of claim 8, wherein the first voltage value is based on an amplitude of a first voltage pulse, the second voltage value is based on an amplitude of a second voltage pulse, and the first and second voltage pulses have different pulse widths.

13. An apparatus comprising:
a first conductive line;
a second conductive line;
a resistive memory cell coupled between the first and second conductive lines;
a driver to drive a first current and a second current through the resistive memory cell during an operation of changing a resistance of the resistive memory cell, the first current having a first value, and the second current having a second value less than the first value; and
a multiplexer to provide first control information to the driver before a value of the resistance of the resistive memory cell reaches a reference resistance value to cause the first current to have the first value based on the first control information, and to provide second control information to the driver after the value of the resistance of the resistive memory cell reaches the reference resistance value to cause the second current to have the second value based on the second control information.

14. The apparatus of claim 13, further comprising:
a resistor coupled between the first conductive line and a third conductive line; and
an additional driver coupled to the third conductive line.

15. The apparatus of claim 13, further comprising a comparator including input nodes coupled to the second and third conductive lines, and an output node coupled to a select node of the multiplexer.

16. The apparatus of claim 13, further comprising a voltage generator to provide a voltage to the first conductive line, the voltage generator including a node to provide a signal indicating whether the voltage on the first conductive line reaches a target voltage value.

17. The apparatus of claim 13, wherein the resistor has a resistance value based on a resistance value range of the resistive memory cell.

18. The apparatus of claim 13, wherein the driver includes a current mirror.

19. The apparatus of claim 13, wherein the driver includes current paths coupled in parallel between the second conductive line and ground.

20. The apparatus of claim 13, wherein the driver is to be biased by a voltage equal to a supply voltage of a memory device that includes the resistive memory cell.

21. The apparatus of claim 13, further comprising:
an additional resistive memory cell;
an additional write driver coupled to the additional resistive memory cell;
an additional comparator coupled to the additional write driver; and
an additional multiplexer coupled to the additional comparator.

22. An apparatus comprising:
a first data line and first resistive memory cells coupled to the first data line;
a second data line and second resistive memory cells coupled to the second data line;
a sense amplifier including a first input node coupled to the first data line, and a second input node coupled to the second data line;
a variable resistor coupled to the second input node of the sense amplifier; and
resistor control circuitry to cause the variable resistor to provide a first resistance during a verify stage of an operation of storing information in one of the first resistive memory cells, and to cause the variable resistor to provide a second resistance during a read operation performed on one of the first resistive memory cells.

23. An apparatus comprising:
a first data line and first resistive memory cells coupled to the first data line;
a second data line and second resistive memory cells coupled to the second data line;

a sense amplifier including a first input node coupled to the first data line, and a second input node coupled to the second data line;

a variable resistor coupled to the second input node of the sense amplifier; and resistor control circuitry to cause the variable resistor to provide a first resistance and a second resistance based on a first control information, and to cause the variable resistor to provide a second resistance based on a second control information.

24. The apparatus of claim 23, wherein the resistor control circuitry includes:

a multiplexer to provide output control information based on a first control information and a second control information;

a decoder to decode the output control information to generate decoded control information; and a logic circuit to cause the variable resistor to provide a resistance based on the decoded control information.

* * * * *